(12) United States Patent
Lee et al.

(10) Patent No.: US 9,799,724 B2
(45) Date of Patent: Oct. 24, 2017

(54) CAPACITOR STRUCTURES, DECOUPLING STRUCTURES AND SEMICONDUCTOR DEVICES INCLUDING THE SAME

(71) Applicants: Jong-Min Lee, Hwaseong-si (KR); Jongryul Jun, Yongin-si (KR); Eun A Kim, Seoul (KR); Jung-Bum Lim, Yongin-si (KR)

(72) Inventors: Jong-Min Lee, Hwaseong-si (KR); Jongryul Jun, Yongin-si (KR); Eun A Kim, Seoul (KR); Jung-Bum Lim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 206 days.

(21) Appl. No.: 14/732,278

(22) Filed: Jun. 5, 2015

(65) Prior Publication Data
US 2016/0073502 A1 Mar. 10, 2016

(30) Foreign Application Priority Data
Sep. 5, 2014 (KR) .................. 10-2014-0118637

(51) Int. Cl.
*H01L 27/108* (2006.01)
*H01L 49/02* (2006.01)
*H01L 27/08* (2006.01)

(52) U.S. Cl.
CPC .......... *H01L 28/90* (2013.01); *H01L 27/0805* (2013.01); *H01L 27/10808* (2013.01); *H01L 27/10817* (2013.01); *H01L 27/10847* (2013.01); *H01L 27/10852* (2013.01); *H01L 28/82* (2013.01); *H01L 28/86* (2013.01); *H01L 28/88* (2013.01); *H01L 28/92* (2013.01)

(58) Field of Classification Search
None
See application file for complete search history.

(56) References Cited

U.S. PATENT DOCUMENTS 7,176,552 B2  2/2007  Park et al.
7,897,999 B2  3/2011  Furuta
(Continued)

FOREIGN PATENT DOCUMENTS

KR  1020010066332  7/2001
KR  1020130072043  7/2013

*Primary Examiner* — Minh-Loan Tran
(74) *Attorney, Agent, or Firm* — Myers Bigel, P.A.

(57) ABSTRACT

Decoupling structures are provided. The decoupling structures may include first conductive patterns, second conductive patterns and a unitary supporting structure that structurally supports the first conductive patterns and the second conductive patterns. The decoupling structures may also include a common electrode disposed between ones of the first conductive patterns and between ones of the second conductive patterns. The first conductive patterns and the common electrode are electrodes of a first capacitor, and the second conductive patterns and the common electrode are electrodes of a second capacitor. The unitary supporting structure may include openings when viewed from a plan perspective. The first conductive patterns and the second conductive patterns are horizontally spaced apart from each other with a separation region therebetween, and none of the openings extend into the separation region.

20 Claims, 25 Drawing Sheets

(56) References Cited

U.S. PATENT DOCUMENTS

| | | |
|---|---|---|
| 7,919,804 B2 | 4/2011 | Horn et al. |
| 7,999,299 B2 | 8/2011 | Lee et al. |
| 8,847,353 B2 | 9/2014 | Hasunuma |
| 2010/0148236 A1* | 6/2010 | Kadoya ............ H01L 27/10814 257/306 |
| 2010/0314715 A1* | 12/2010 | Fujimoto ............ H01L 27/0207 257/532 |
| 2011/0115052 A1* | 5/2011 | Sugioka ............ H01L 27/10814 257/532 |
| 2011/0169061 A1* | 7/2011 | Sukekawa ......... H01L 27/10852 257/296 |
| 2012/0092843 A1 | 4/2012 | Kitano et al. |
| 2013/0242643 A1 | 9/2013 | Kim et al. |
| 2013/0256832 A1 | 10/2013 | Yoo et al. |

\* cited by examiner

CAPACITOR STRUCTURES, DECOUPLING STRUCTURES AND SEMICONDUCTOR DEVICES INCLUDING THE SAME

CROSS-REFERENCE TO RELATED APPLICATION

This U.S. non-provisional patent application claims priority under 35 U.S.C. §119 to Korean Patent Application No. 10-2014-0118637, filed on Sep. 5, 2014, in the Korean Intellectual Property Office, the disclosure of which is hereby incorporated by reference in its entirety.

BACKGROUND OF THE INVENTION

The present disclosure generally relates to the field of electronics and, more particularly, to a semiconductor device having a capacitor.

Many electronic devices include capacitors for various purposes. As an example, capacitors may be used as memory elements in a semiconductor memory device (e.g., DRAM). As another example, capacitors may be used to store electric energy in an energy storage device.

Capacitors may also be used in a decoupling circuit of a semiconductor device to reduce the effects of noise produced in one portion of the semiconductor device to other portions thereof. A semiconductor device may include multiple decoupling circuits and the decoupling circuits may increase the size of the semiconductor device.

SUMMARY

An integrated circuit device may include a decoupling structure having a first capacitor and a second capacitor that is different from the first capacitor. The decoupling structure may include a first plurality of conductive patterns that each extend in a vertical direction, a second plurality of conductive patterns that each extend in the vertical direction, a horizontally disposed unitary supporting structure that structurally supports the first plurality of conductive patterns and the second plurality of conductive patterns and a common electrode disposed between ones of the first plurality of conductive patterns and between ones of the second plurality of conductive patterns. The first plurality of conductive patterns and the common electrode may be electrodes of the first capacitor, and the second plurality of conductive patterns and the common electrode may be electrodes of the second capacitor. The first plurality of conductive patterns and the second plurality of conductive patterns may be horizontally spaced apart from each other in a first direction with a separation region therebetween. The decoupling structure may be mounted on an underlying lower structure so that the lower structure and the decoupling structure may be stacked in the vertical direction, and the unitary supporting structure may include a plurality of openings when viewed from above. None of the plurality of openings may extend into the separation region.

In various embodiments, a minimum width of each of the plurality of openings may be less than two times a thickness in the vertical direction of a portion of the common electrode that is disposed on an upper surface of the unitary supporting structure.

In various embodiments, the unitary supporting structure may extend across the separation region.

According to various embodiments, a width of the separation region in the first direction may be less than two times a thickness in the vertical direction of a portion of the common electrode that is disposed on an upper surface of the unitary supporting structure.

In various embodiments, a first portion of the common electrode may overlie an upper surface of the unitary supporting structure, and an upper surface of the first portion of the common electrode may be disposed at a level higher than an upper surface of each of the first plurality of conductive patterns.

According to various embodiments, the upper surface of the unitary supporting structure may be disposed at a level higher than the upper surface of the each of the first plurality of conductive patterns.

According to various embodiments, the device may further include a substrate underneath the decoupling structure and a pair of conductive plates disposed between the substrate and the common electrode. The pair of conductive plates may include a first conductive plate that is electrically connected to the first plurality of conductive patterns and a second conductive plate that is electrically connected to the second plurality of conductive patterns. The first conductive plate and the second conductive plate may be horizontally spaced apart from each other with a gap therebetween, and the gap may be disposed between the first plurality of conductive patterns and the second plurality of conductive patterns.

In various embodiments, the device may additionally include an insulating pattern between the pair of conductive plates and the common electrode. The insulating pattern may include an upper portion and a lower portion that protrudes toward the substrate in the gap between the first conductive plate and the second conductive plate.

In various embodiments, the device may also include a third conductive plate between the pair of conductive plates and the substrate.

According to various embodiments, the first conductive plate and the third conductive plate may be electrodes of a third capacitor, and the second conductive plate and the third conductive plate may be electrodes of a fourth capacitor that is different from the third capacitor.

In various embodiments, the first capacitor and the second capacitor may be connected in series, and the third capacitor and the fourth capacitor may be connected in series. The first capacitor and the second capacitor may be connected in parallel to the third capacitor and the fourth capacitor.

In various embodiments, the gap between the first conductive plate and the second conductive plate may be a first gap, and the device further may include a third conductive plate and a fourth conductive plate between the pair of conductive plates and the substrate. The third conductive plate and the fourth conductive plate may be horizontally spaced apart from each other with a second gap therebetween, and the second gap may be disposed between the first plurality of conductive patterns and the second plurality of conductive patterns. The first conductive plate and the third conductive plate may be electrodes of a third capacitor, and the second conductive plate and the fourth conductive plate may be electrodes of a fourth capacitor that is different from the third capacitor.

According to various embodiments, each of the first plurality of conductive patterns may have a height at least 20 times greater than a width of the each of the first plurality of conductive patterns.

According to various embodiments, each of the first plurality of conductive patterns may include a recess therein and may include an electrode of a one cylinder storage (OCS) capacitor. The integrated circuit device may further include a capacitor dielectric layer that may be disposed on both an outer sidewall and a sidewall of the recess of the each of the first plurality of conductive patterns.

In various embodiments, an unfilled void may be disposed underneath the unitary supporting structure.

In various embodiments, the first capacitor and the second capacitor may be connected in series.

A decoupling structure may include a plurality of vertically disposed electrode patterns on a substrate. The plurality of electrode patterns may include first electrode patterns disposed along a first horizontal direction at a first interval and second electrode patterns disposed along the first horizontal direction at a second interval. The first electrode patterns and the second electrode patterns may be spaced apart from each other in the first horizontal direction with a separation region therebetween, and the separation region may have a width in the first horizontal direction greater than the first interval or the second interval. The decoupling structure may further include a unitary supporting structure at least partially surrounding respective sidewalls of the first electrode patterns and respective sidewalls of the second electrode patterns. The unitary supporting structure may include a plurality of openings when viewed from a plan perspective, and none of the plurality of openings may extend into the separation region. The decoupling structure may also include a common electrode disposed between ones of the first electrode patterns and between ones of the second electrode patterns.

According to various embodiments, the unitary supporting structure may extend across the separation region.

In various embodiments, a portion of the common electrode may overlie a portion of the unitary supporting structure that crosses the separation region.

According to various embodiments, the first interval and the second interval may be substantially equal.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
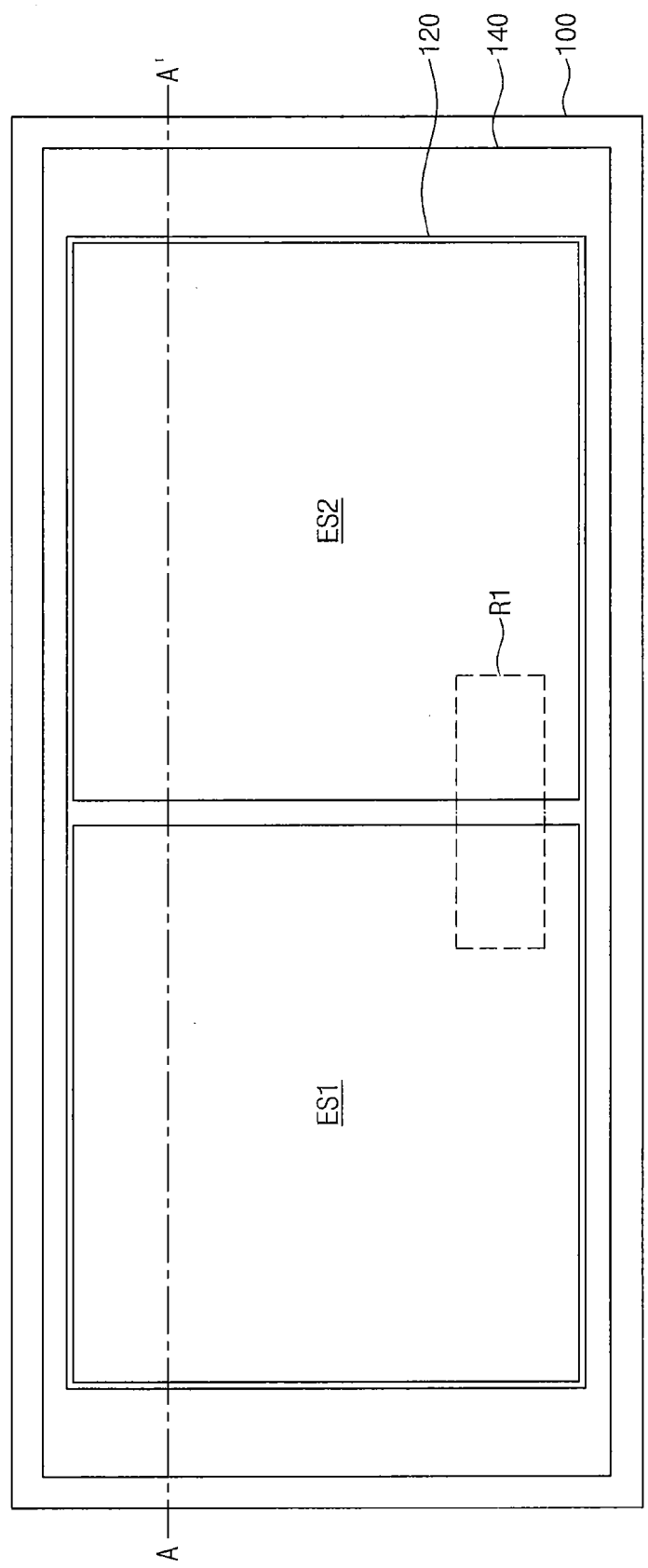
FIG. 1 is a plan view schematically illustrating a capacitor structure according to example embodiments of the inventive concepts.

It should be noted that these figures are intended to illustrate the general characteristics of methods, structures and/or materials utilized in certain example embodiments and to supplement the written description provided below. These drawings are not, however, necessarily to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or"

includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, where a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
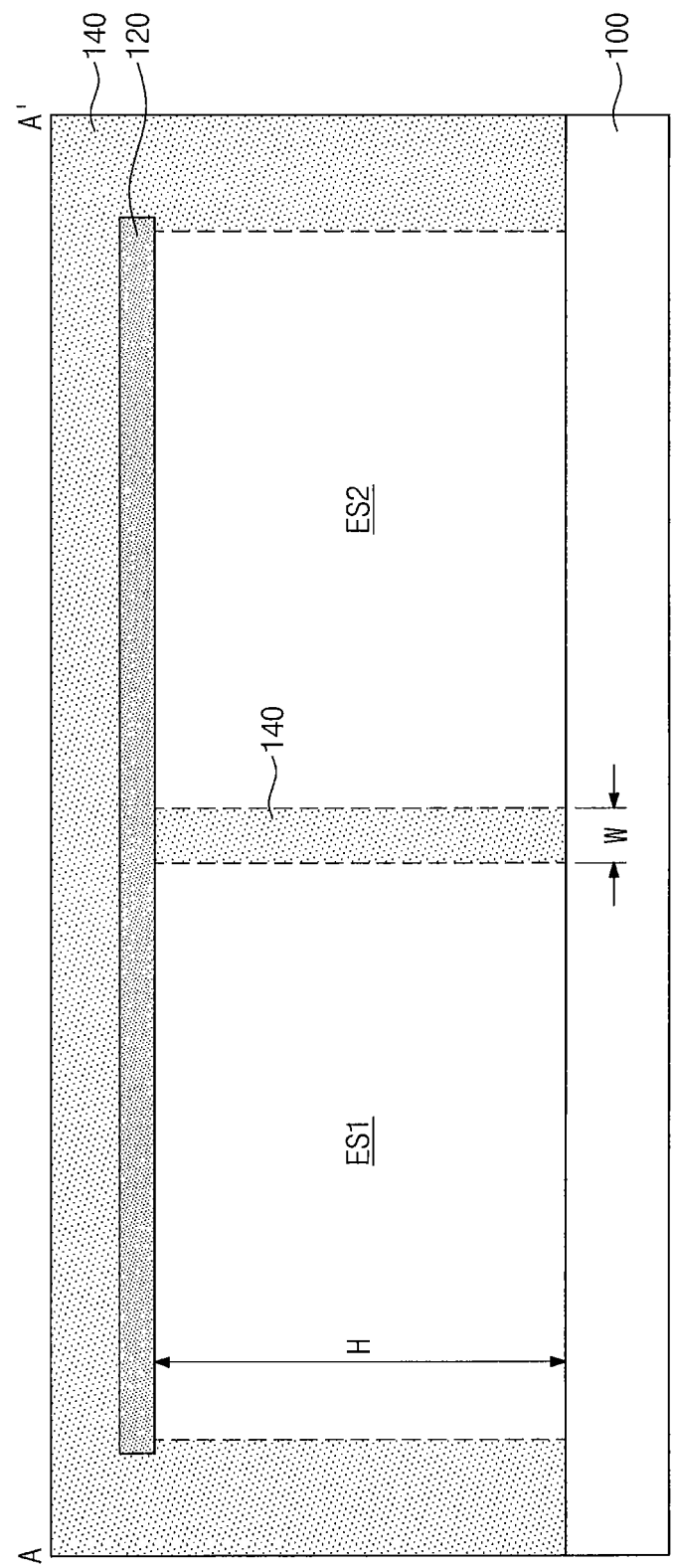
FIG. 2 is a sectional view taken along the line A-A' of FIG. 1.

FIG. 1 is a plan view schematically illustrating a capacitor structure according to example embodiments of the inventive concepts, and FIG. 2 is a sectional view taken along the line A-A' of FIG. 1.

Referring to FIGS. 1 and 2, a common electrode 140 may be provided on a lower structure 100, and first and second electrode structures ES1 and ES2 may be provided in the common electrode 140. Each of the first and second electrode structures ES1 and ES2 may extend in a vertical direction above the lower structure 100 and may have a height H in the vertical direction. The first and second electrode structures ES1 and ES2 may be spaced apart from each other, and a portion of the common electrode 140 may be interposed between the first and second electrode structures ES1 and ES2. In some embodiments, a space between the first and second electrode structures ES1 and ES2 may have a width W that is less than the height H of the first and second electrode structures ES1 and ES2.

Furthermore, at least one supporting structure may be provided in the common electrode 140 to mechanically and/or structurally support the first and second electrode structures ES1 and ES2. The supporting structure may extend on the first and second electrode structures ES1 and ES2. For example, as shown in FIG. 2, the supporting structure may include an upper supporting layer 120, which may be provided at upper portions of the first and second electrode structures ES1 and ES2. The upper supporting layer 120 may have a unitary structure that structurally supports both the first electrode structure ES1 and the second electrode structure ES2 and extends across a region between the first electrode structure ES1 and the second electrode structure ES2. In some embodiments, the upper supporting layer 120 may be buried in the common electrode 140, and the first and second electrode structures ES1 and ES2 may penetrate the upper supporting layer 120.

Figure 3:
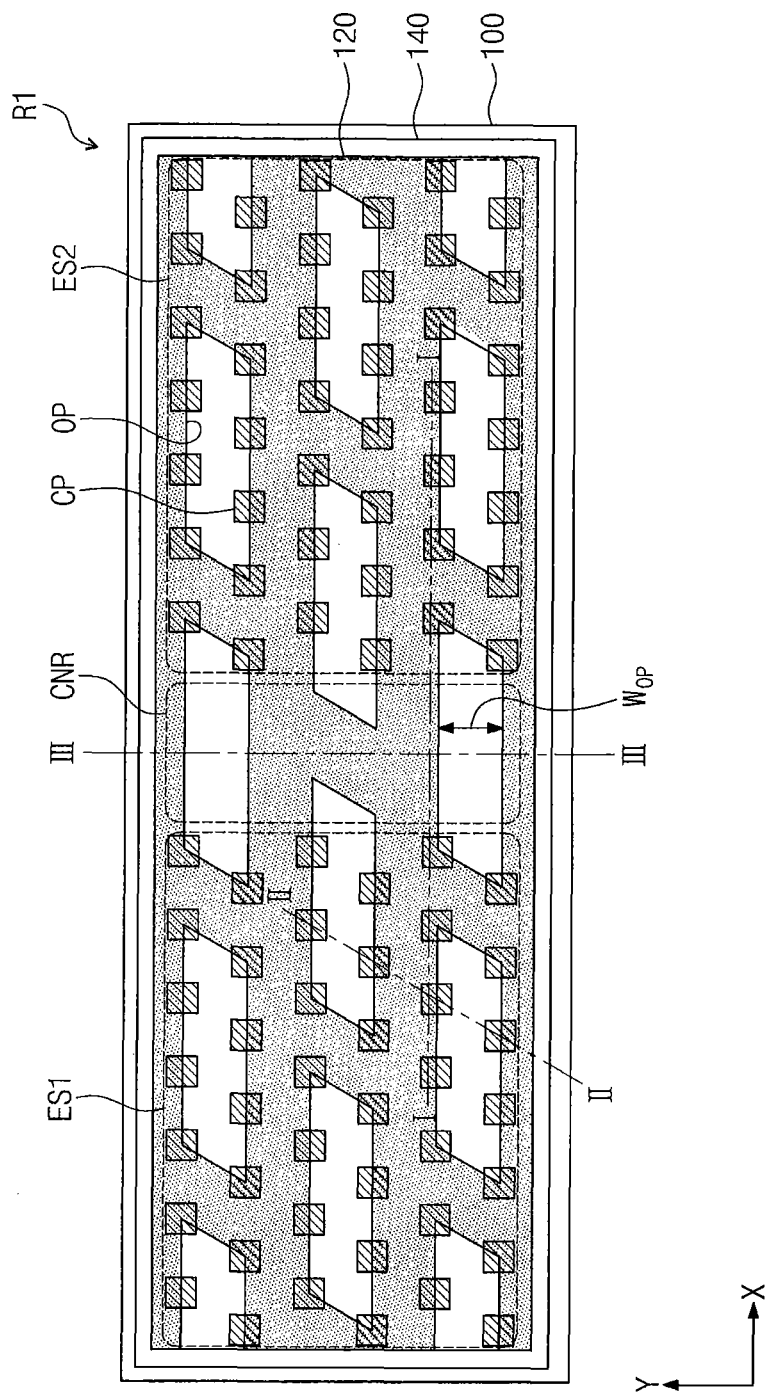
FIG. 3 is an enlarged plan view of the region R1 of FIG. 1 illustrating a capacitor structure according to example embodiments of the inventive concepts.
Figure 3A:
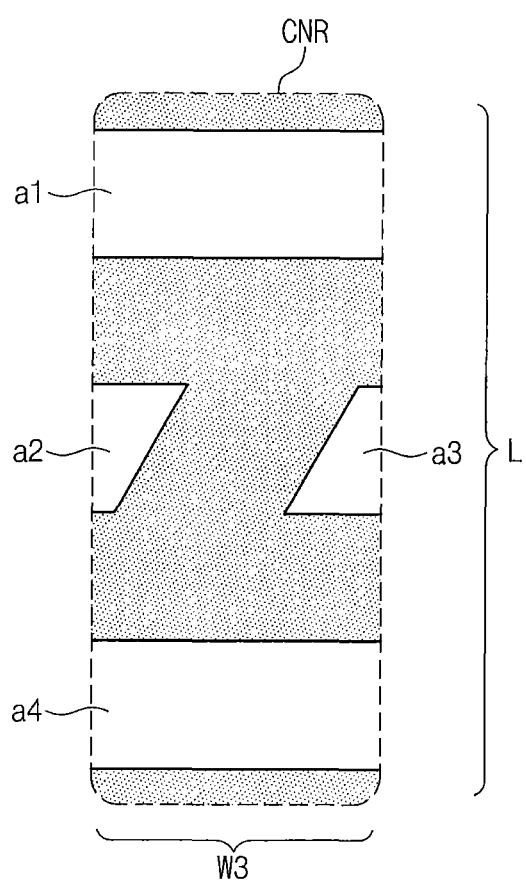
FIG. 3A is an enlarged plan view of the region CNR of FIG. 3.
Figure 4:
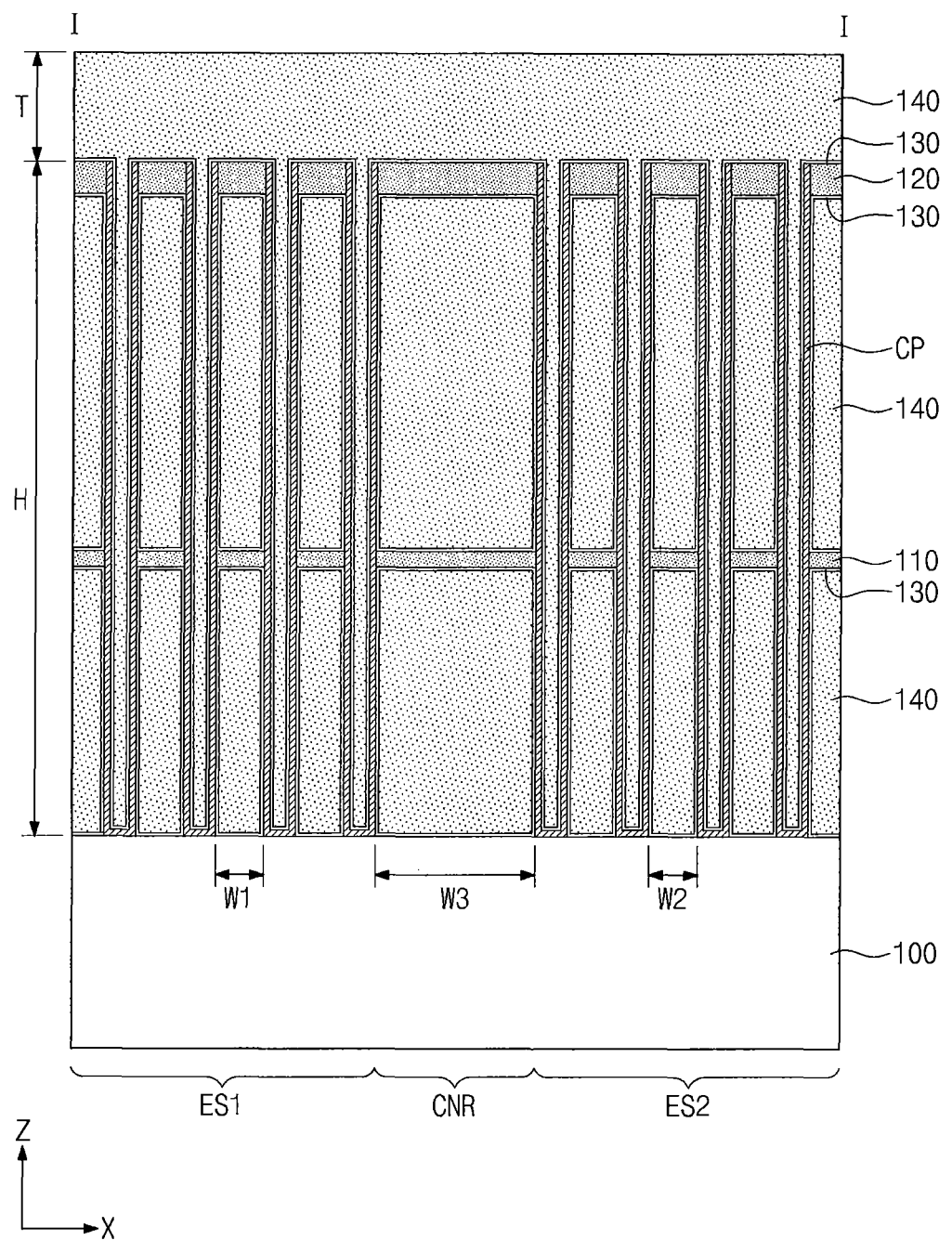
FIG. 4 and FIG. 4A are sectional views taken along the dotted line I-I of FIG. 3.
Figure 4A:
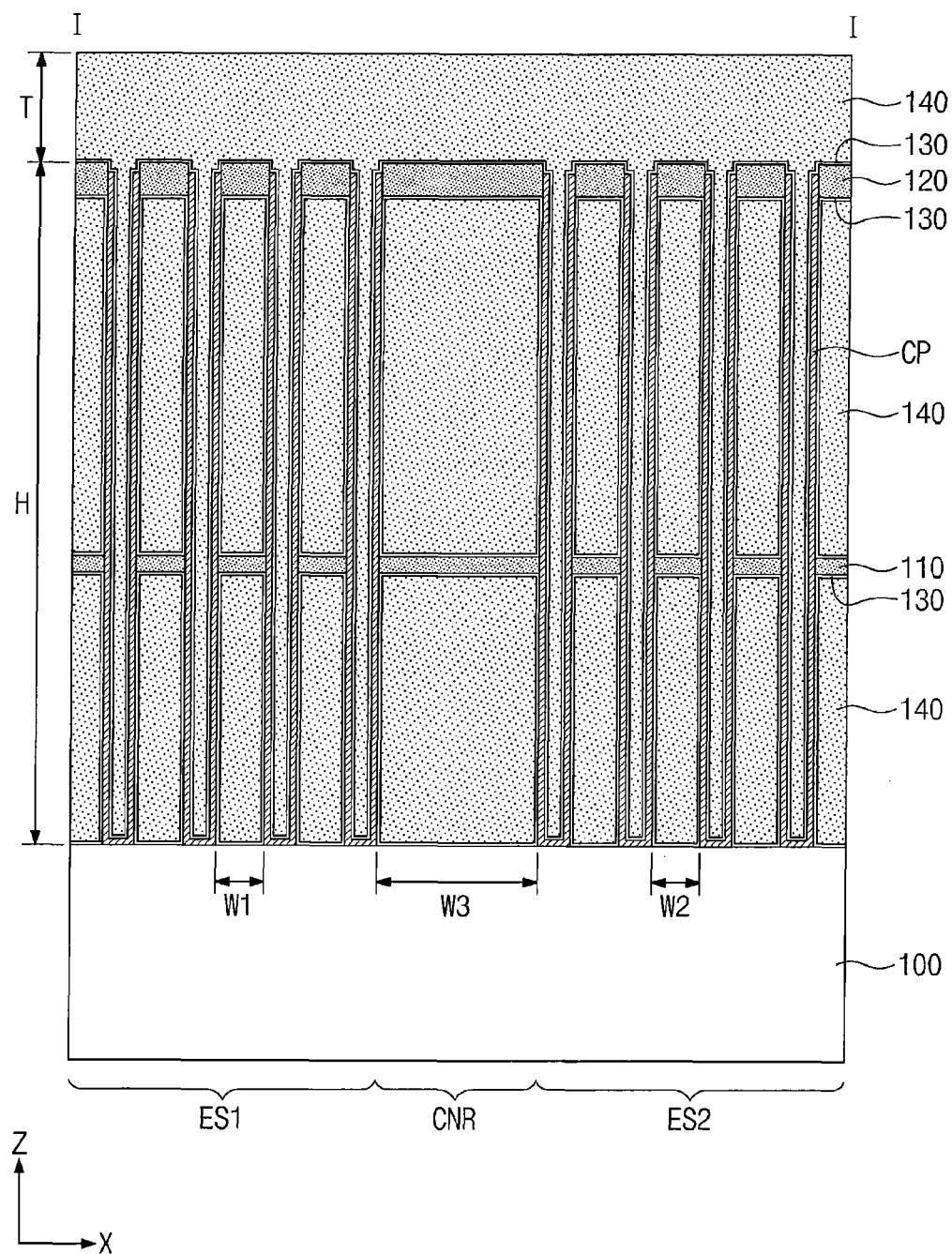
Figure 5:
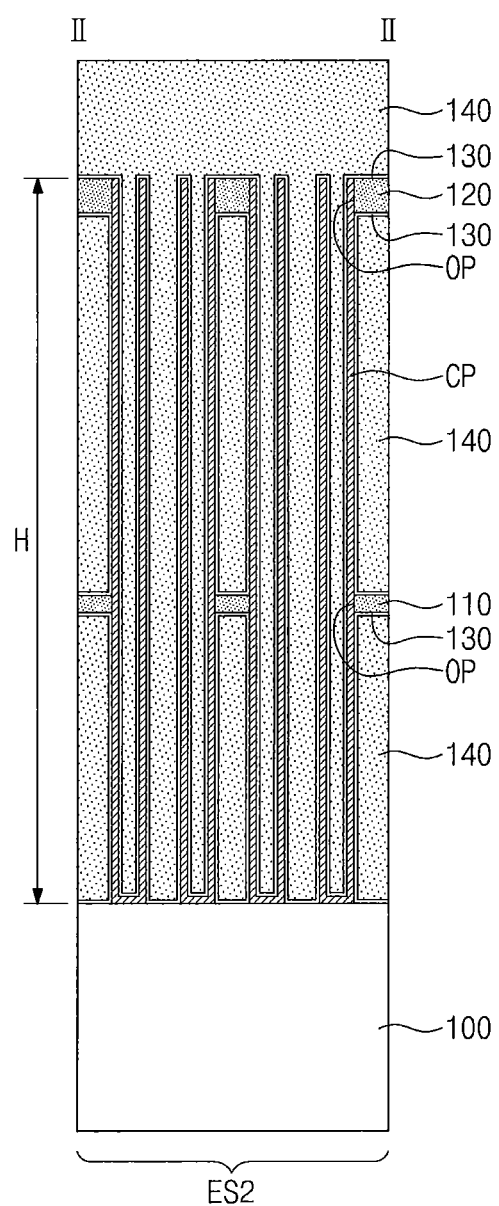
FIG. 5 is a sectional view taken along the dotted line II-II of FIG. 3.
Figure 6:
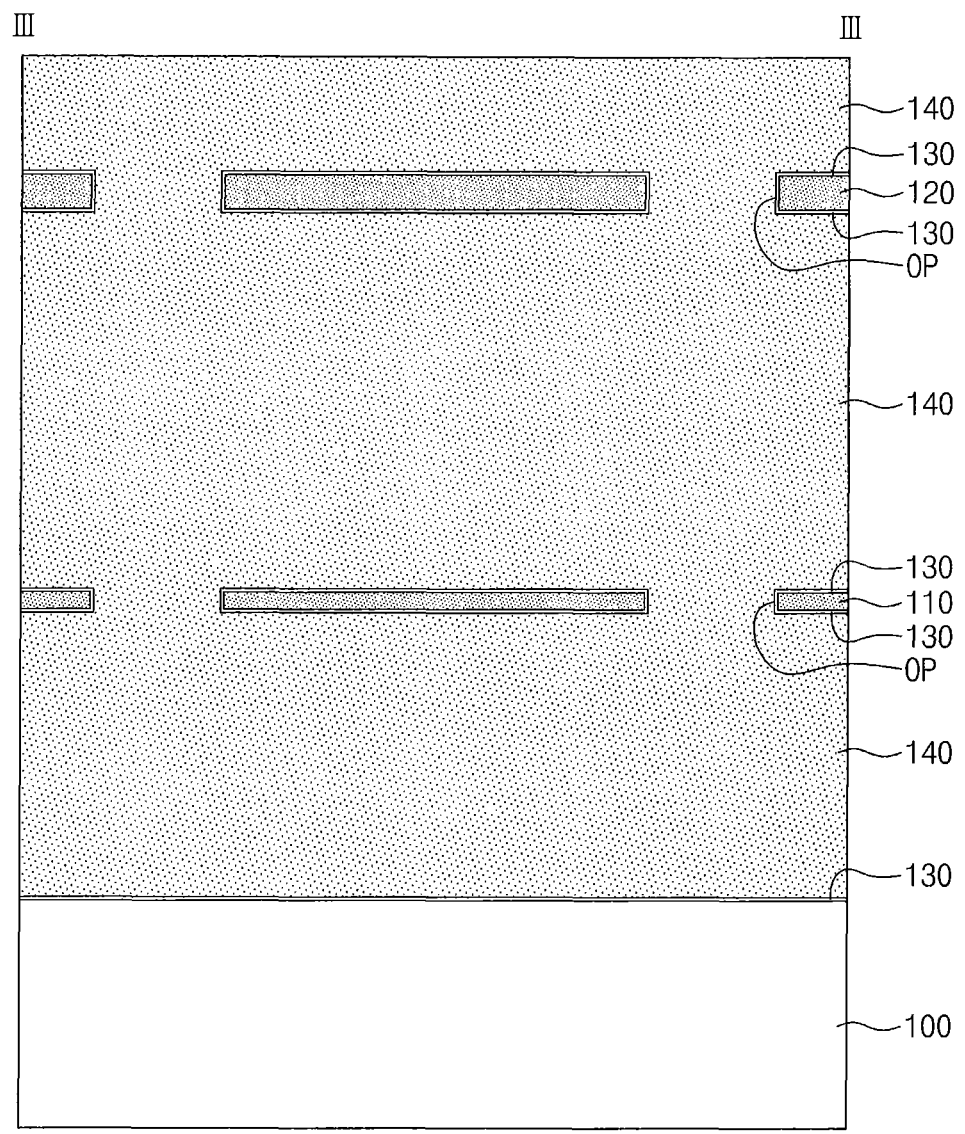
FIG. 6 is a sectional view taken along the dotted line III-III of FIG. 3.

FIG. 3 is an enlarged plan view of the region R1 of FIG. 1 illustrating a capacitor structure according to example embodiments of the inventive concepts. FIG. 3A is an enlarged plan view of the region CNR of FIG. 3. FIG. 4 and FIG. 4A are sectional views taken along the dotted line I-I of FIG. 3, FIG. 5 is a sectional view taken along the dotted line II-II of FIG. 3, and FIG. 6 is a sectional view taken along the dotted line of FIG. 3.

Referring to FIG. 3, a capacitor structure may include a first electrode structure ES1 and a second electrode structure ES2 on a lower structure 100. A separation region CNR may be disposed between the first and second electrode structures ES1 and ES2. Each of the first and second electrode structures ES1 and ES2 may include conductive patterns CP. The conductive patterns CP may be two-dimensionally or three-dimensionally arranged on the lower structure 100. In some embodiments, the conductive patterns CP may be disposed along a first horizontal direction (X direction) and a second horizontal direction (Y direction). The X direction may be substantially perpendicular to the Y direction.

The capacitor structure may also include an upper supporting layer 120 that structurally supports the conductive patterns CP. The upper supporting layer 120 may have a unitary structure that supports the conductive patterns CP both in the first electrode structure ES1 and in the second electrode structure ES2 and extends across the separation region CNR. The supporting layer 120 may include openings OP. In some embodiments, each of the openings OP may have a minimum width Wop in the Y direction as illustrated in FIG. 3. In some embodiments, each of the openings OP may have a minimum width in the X direction. The capacitor structure may further include a common electrode 140 on the upper supporting layer 120.

Referring to FIG. 3A, a horizontal cross-section of the separation region CNR may be a rectangle that has a width W3 and a length L and may include four portions of the openings OP. In some embodiments, a number of the portions of the openings OP may be less than or greater than four. Areas of horizontal cross-sections of the portions of the openings are a1, a2, a3 and a4. In some embodiments, a sum of the areas a1, a2, a3 and a4 may be less than 50% of an area of the horizontal cross-section of the separation region CNR (i.e., area of the rectangle W3·L).

Figure 9:
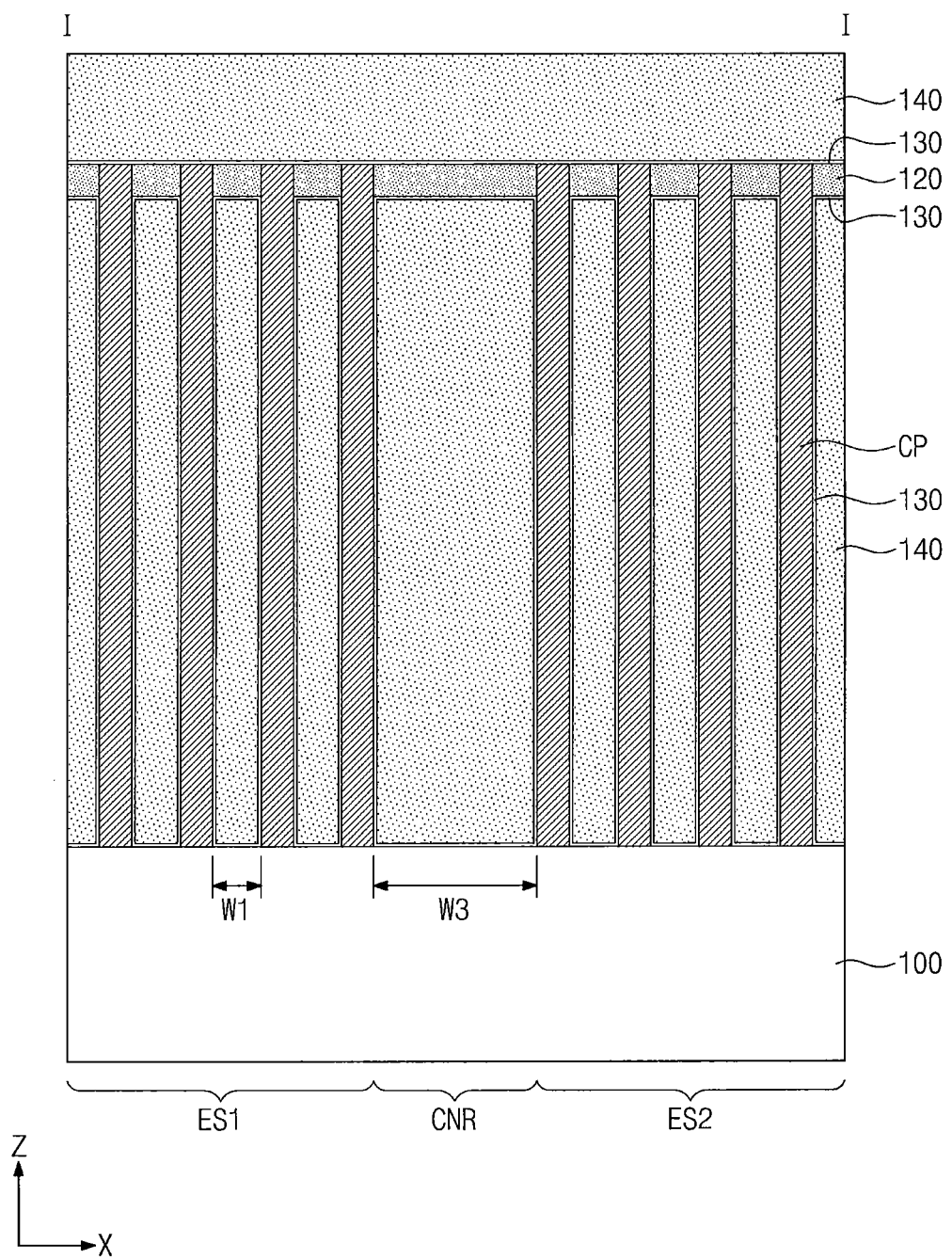
Figure 10:
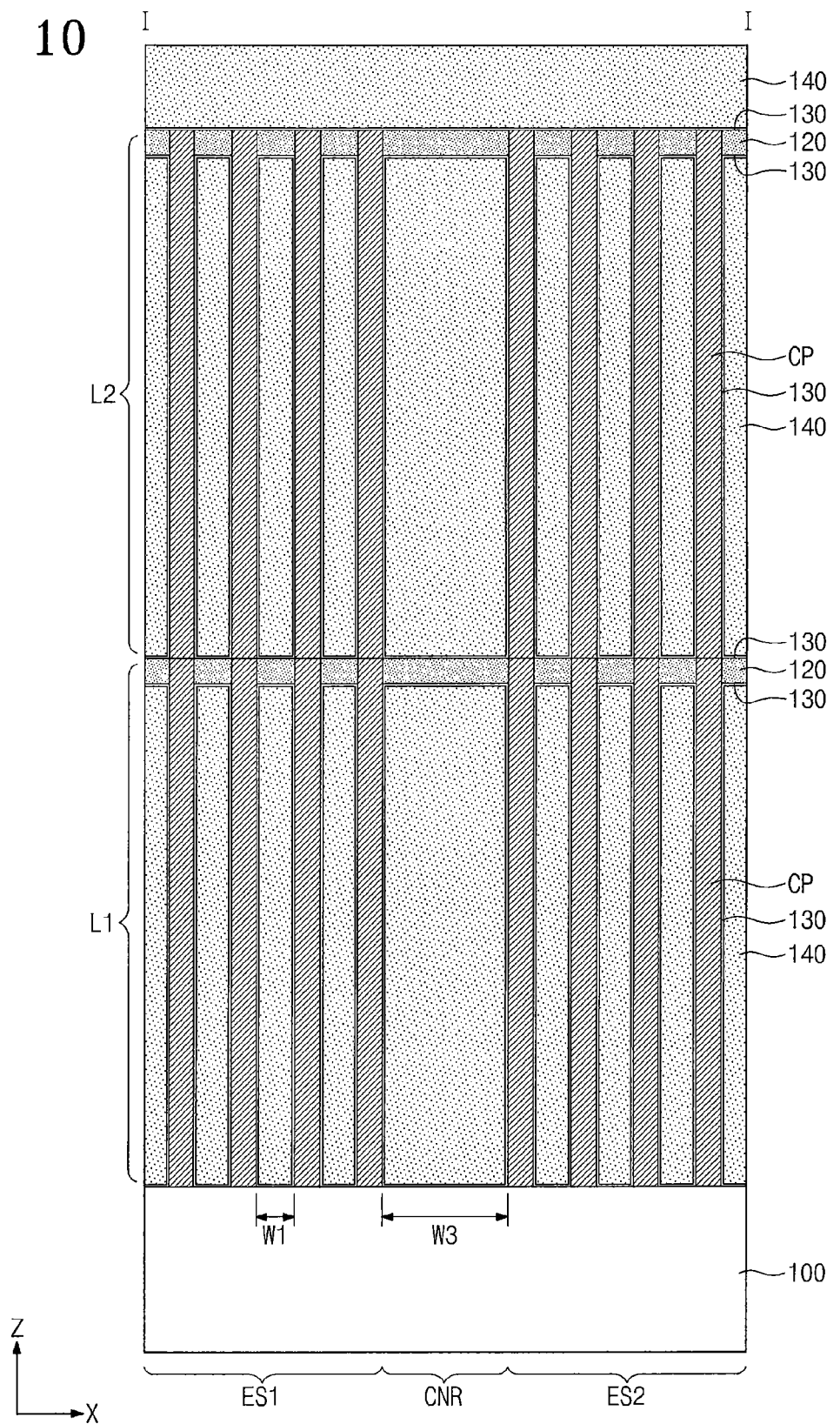

In some embodiments, each of the conductive patterns CP may be shaped like a cylinder with an open top and a closed bottom, as shown in FIGS. 4 and 5. For example, each of the conductive patterns CP may have a cup-shaped structure. In some embodiments, as shown in FIGS. 9 and 10, each of the conductive patterns CP may be shaped like a solid cylinder. The cylinder may have, for example, circular or square horizontal cross-sections.

Referring to FIG. 4, each of the conductive patterns CP may extend in a vertical direction (Z direction) and may have a height H in the Z direction. The Z direction may be substantially perpendicular to the X and Y directions. For example, each of the conductive patterns CP may be formed to have an aspect ratio of about 20 or greater. The conductive patterns CP may have a sufficiently high structural stability in spite of a high aspect ratio since the conductive patterns CP are supported by a supporting structure. The supporting structure may include an intermediate supporting layer 110 and the upper supporting layer 120. In each of the first and second electrode structures ES1 and ES2, the conductive patterns CP may be arranged at regular intervals. The conductive patterns CP in the first electrode structure ES1 may be arranged along the X direction at a first interval W1, and the conductive patterns CP in the second electrode structure ES2 may be arranged along the X direction at a second interval W2. In some embodiments, the first interval W1 and the second interval W2 may be substantially equal. The separation region CNR has a width W3 in the X direction, and the width W3 may be greater than the first interval W1 or the second interval W2. The width W3 of the separation region CNR may be smaller than the height H of the conductive patterns CP. For example, the width W3 may be in a range of about 1500 Å to about 3000 Å.

A portion of the common electrode 140 may be disposed on an upper surface of the upper supporting layer 120 that is disposed in the separation region CNR. The portion of the common electrode 140 on the upper supporting layer 120 has a thickness T in the Z direction. The width W3 of the separation region CNR may be less than two times the thickness T of the portion of the common electrode 140 on the upper supporting layer 120. Referring again to FIG. 3, the minimum width Wop of the openings OP may be less than two times the thickness T of the portion of the common electrode 140 on the upper supporting layer 120. For example, the thickness T may be in a range of about 2000 Å to about 2300 Å.

Referring to FIGS. 5 and 6, the intermediate supporting layer 110 may also be formed to have openings OP. Each of the openings OP of the upper supporting layer 120 may overlap with each of the openings OP of the intermediate supporting layer 110. Referring again to FIG. 3, each of the openings OP may have a sidewall, which is formed to be in contact with at least two of the conductive patterns CP. In other words, each of the openings OP may be formed to expose at least two of the conductive patterns CP. For example, each of the conductive patterns CP may be provided to be in partial contact with and penetrate a sidewall of a corresponding one of the openings OP.

The common electrode 140 may be provided to enclose the supporting structure and the conductive patterns CP. For example, the intermediate and upper supporting layers 110 and 120 may be disposed in the common electrode 140. In other words, the common electrode 140 may include horizontal portions, which are provided on top and bottom surfaces of the intermediate and upper supporting layers 110 and 120, and vertical connecting portions, which are provided in the openings OP and physically and electrically connect the horizontal portions of the common electrode 140 to each other.

In some embodiments, the conductive patterns CP may have a cup-shaped structure, and the common electrode 140 may include outer portions provided on outer sidewalls of the conductive patterns CP and inner portions provided on inner sidewalls of the conductive patterns CP. Portions of the horizontal portions of the common electrode 140 may be used as the outer portions. In some embodiments, the conductive patterns CP may have a solid cylindrical structure, and the common electrode 140 may not include inner portions provided on inner sidewalls of the conductive patterns CP, as shown in FIGS. 9 and 10.

Still referring to FIGS. 5 and 6, the conductive patterns CP may be provided in both the common electrode 140 and the intermediate and upper supporting layers 110 and 120. In other words, each of the conductive patterns CP may penetrate a corresponding one of the openings OP of the intermediate and upper supporting layers 110 and 120 and the horizontal portions of the common electrode 140.

The capacitor structure may further include a capacitor dielectric layer 130 interposed between the common electrode 140 and the supporting structure and between the common electrode 140 and the conductive patterns CP. In other words, the conductive patterns CP may be electrically isolated from the common electrode 140 by the capacitor dielectric layer 130. In some embodiments, the conductive patterns CP in the first electrode structure ES1 and the common electrode 140 may constitute the electrodes of a first capacitor, and the conductive patterns CP in the second electrode structure ES2 and the common electrode 140 may constitute the electrodes of a second capacitor that is different from the first capacitor. Each of the conductive patterns CP may be an electrode of one cylinder storage (OCS) capacitor.

The conductive patterns CP may be formed of or include at least one of polysilicon, metals, metal silicides, or metal nitrides. The capacitor dielectric layer 130 may be formed of or include at least one of oxides (e.g., a silicon oxide layer), nitrides (e.g., a silicon nitride layer), oxynitrides (e.g., a silicon oxynitride layer), or high-k materials (e.g., a hafnium oxide layer). The intermediate and upper supporting layers 110 and 120 may be formed of an insulating material. For example, at least one of the intermediate and upper supporting layers 110 and 120 may be formed of or include at least one of oxides, nitrides, or oxynitrides.

FIGS. 7 through 10 are sectional views, taken along the dotted line I-I of FIG. 3, illustrating capacitor structures according to example embodiments of the inventive concepts. Referring to FIGS. 4 and 7 through 9, the capacitor structure may include first and second electrode structures ES1 and ES2. In some embodiments, each of the first and second electrode structures ES1 and ES2 may have a multi-layered structure. For example, each of the first and second electrode structures ES1 and ES2 may include two layers that are sequentially stacked on the lower structure 100 in the vertical direction (Z direction), and each of the two layers may have one of the structures shown in FIGS. 4, 7, 8, and 9. For example, each of the first and second electrode structures ES1 and ES2 may include first and second layers L1 and L2, as shown in FIG. 10, and each of the first and second layers L1 and L2 of FIG. 10 may have the structure shown in FIG. 9. In some embodiments, the first and second layers L1 and L2 may have different structures. For example, the first layer L1 may have one of the structures shown in FIGS. 4, 7, 8, and 9, and the second layer L2 may have another one of the structures shown in FIGS. 4, 7, 8, and 9.

Figure 7:
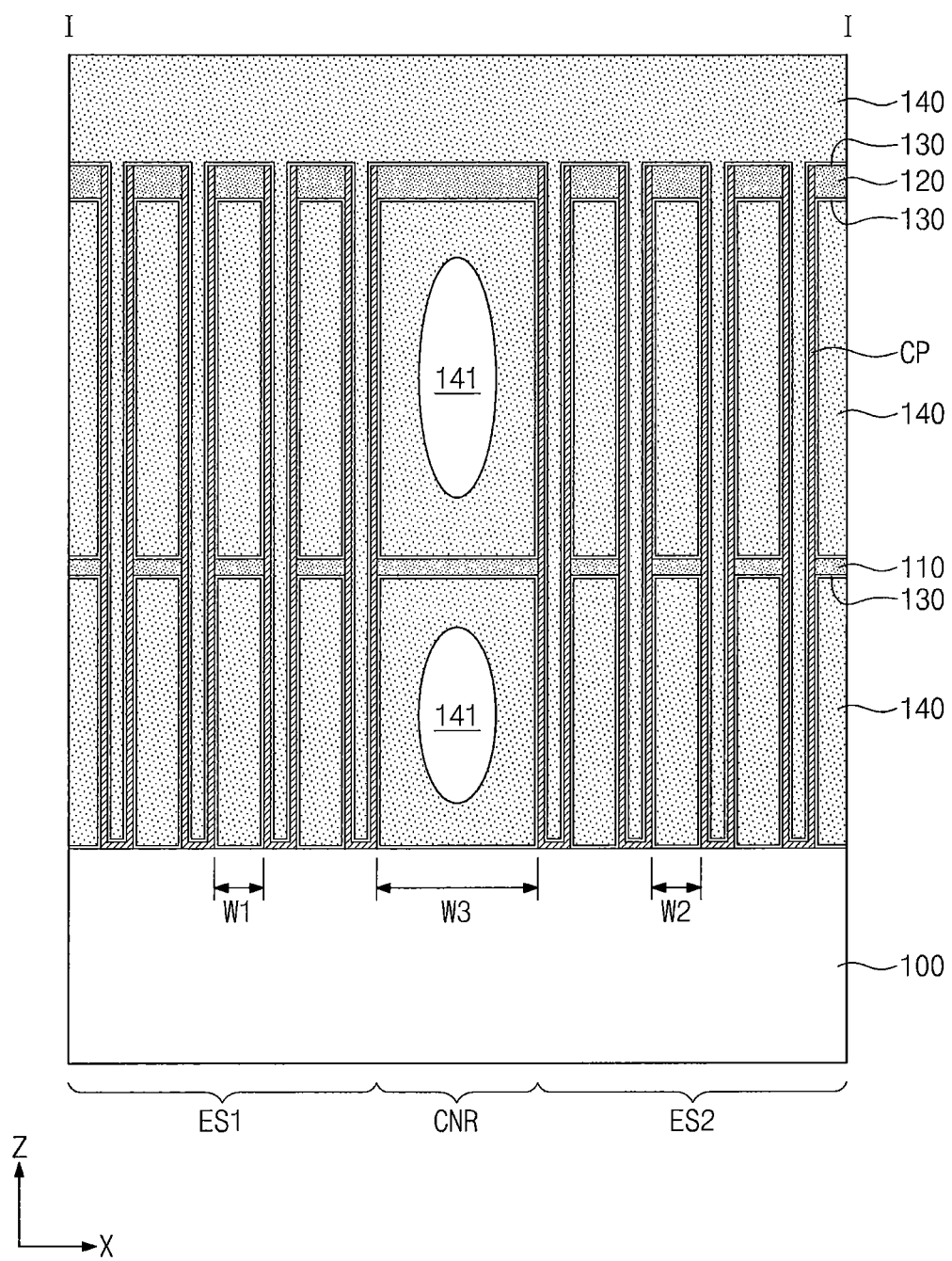
FIGS. 7 through 10 are sectional views, taken along the dotted line I-I of FIG. 3, illustrating capacitor structures according to other example embodiments of the inventive concepts.
Figure 8:
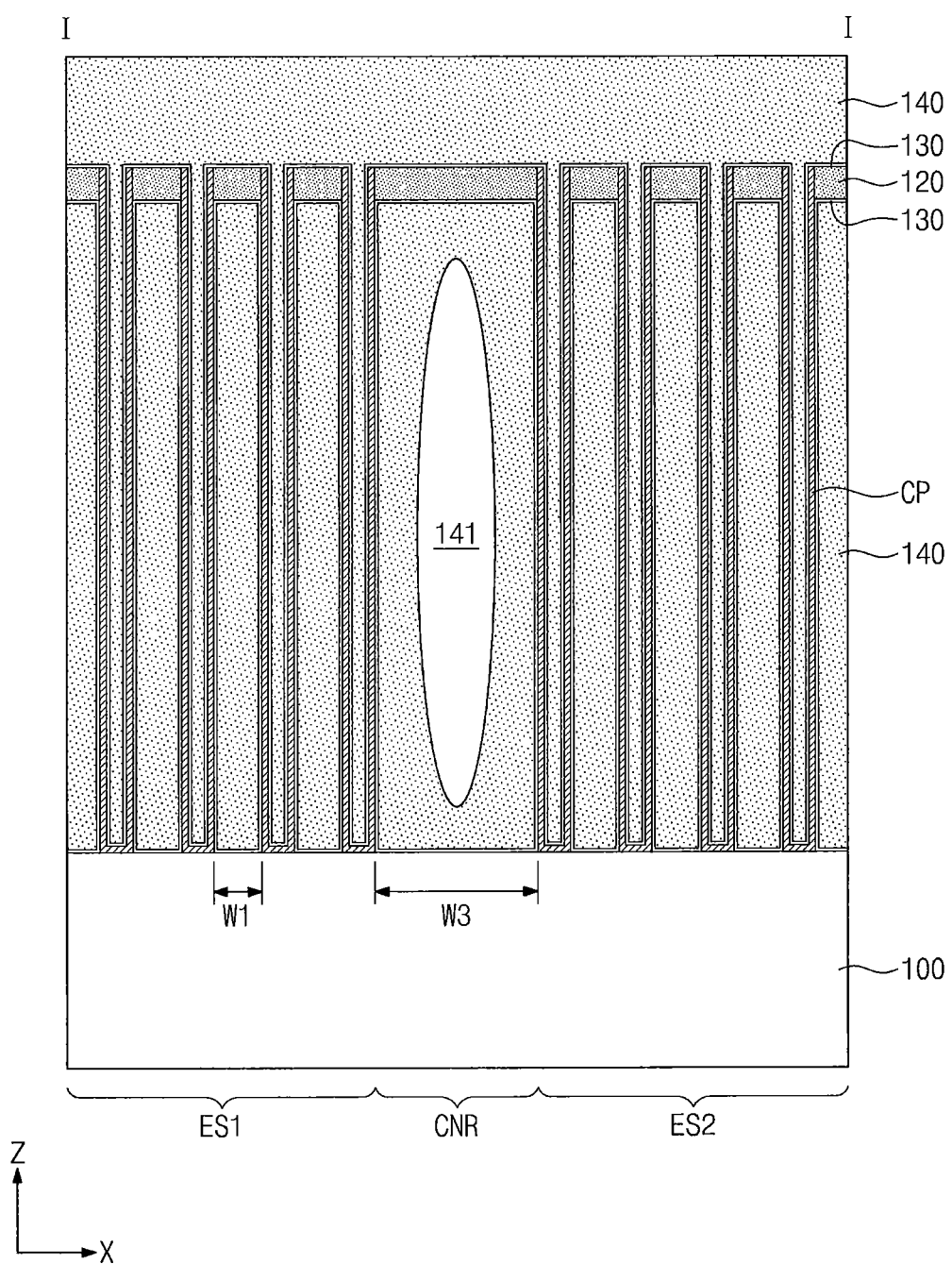

The capacitor structure may include a supporting structure to structurally support the conductive patterns CP. The supporting structure may include one or more supporting layers which are provided at different vertical levels of the conductive patterns CP. For example, as shown in FIGS. 4, 4A and 7, the supporting structure may include the upper supporting layer 120, which is provided to be in contact with upper sidewalls of the conductive patterns CP, and an intermediate supporting layer 110, which is provided to be in contact with intermediate sidewalls of the conductive patterns CP. The conductive patterns CP may vertically penetrate the intermediate and upper supporting layers 110 and 120. A top surface of the upper supporting layer 120 may be disposed at a level equal to top surfaces of the conductive patterns CP as illustrated in FIG. 4 or at a level higher than top surfaces of the conductive patterns CP as illustrated in FIG. 4A. In some embodiments, as shown in FIGS. 8 and 9, the supporting structure may include the upper supporting layer 120, which is provided to be in contact with the upper sidewalls of the conductive patterns CP, and the intermediate supporting layer 110 of FIGS. 4 and 7 may be omitted. In other embodiments, the supporting structure may include the intermediate supporting layer 110, and the upper supporting layer 120 may be omitted.

Figure 11:
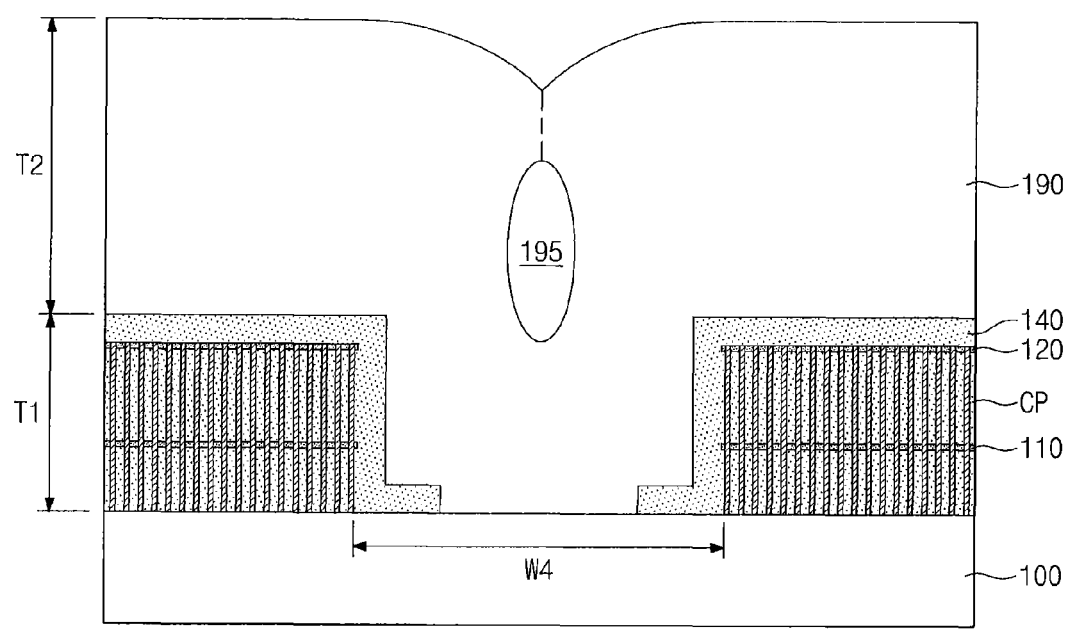
FIG. 11 is a sectional view illustrating a capacitor structure.

FIG. 11 is a sectional view illustrating a capacitor structure. As appreciated by the present inventors, the capacitor structure may include a void 195 in an upper interlayer insulating layer 190 as illustrated in FIG. 11. Specifically, when a distance W4 between the first and second electrode structures ES1 and ES2 is large and the intermediate and upper supporting layers 110 and 120 do not extend across a region between the first and second electrode structures ES1 and ES2, the void 195 may be formed. The upper interlayer insulating layer 190 may have a thickness T2 greater than a height T1 of the common electrode 140 above the supporting structure 100.

The void 195 may be exposed during subsequent processes (e.g., planarization process of the upper interlayer insulating layer 190), and the void 195 may be filled with a conductive material for interconnection lines. The conductive material in the void 195 may cause an electrical connection between adjacent interconnection lines and may cause an electrical failure.

Figure 12:
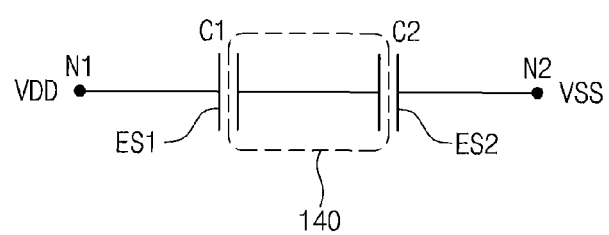
FIG. 12 is a circuit diagram illustrating a decoupling circuit according to example embodiments of the inventive concepts.
Figure 13:
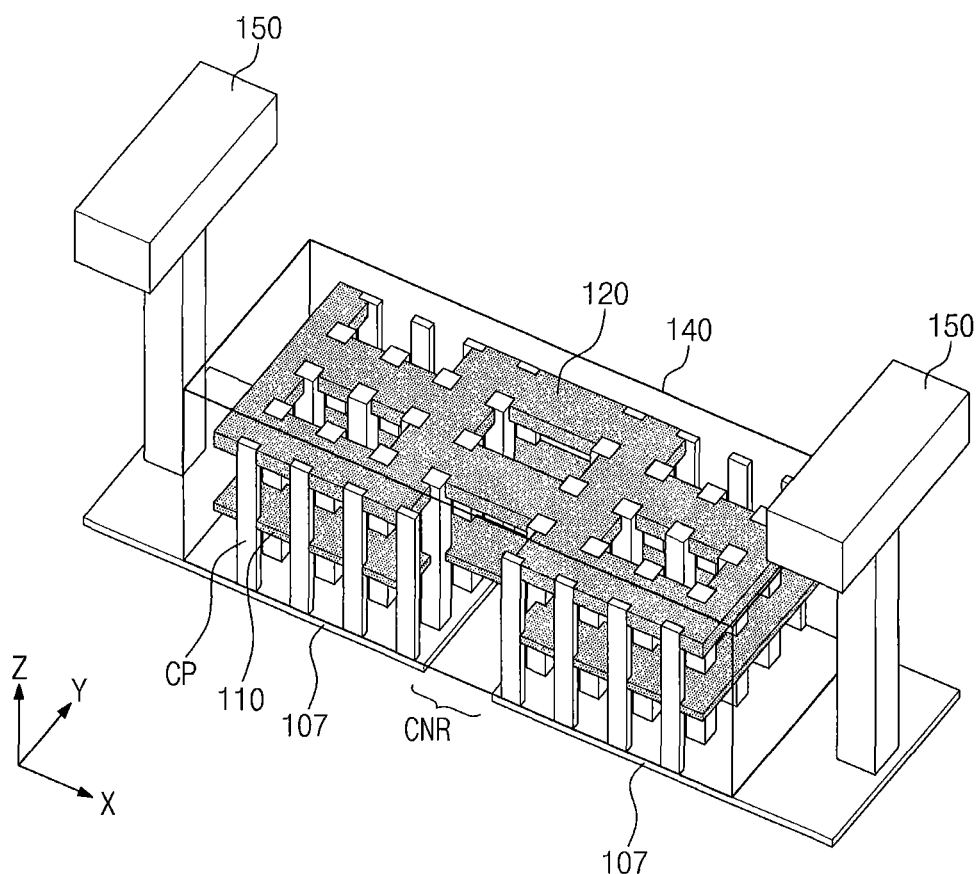
FIG. 13 is a perspective view illustrating a decoupling structure according to example embodiments of the inventive concepts.

FIG. 12 is a circuit diagram illustrating a decoupling circuit according to example embodiments of the inventive concepts, and FIG. 13 is a perspective view illustrating a decoupling structure according to example embodiments of the inventive concepts.

Referring to FIG. 12, the decoupling circuit according to example embodiments of the inventive concepts may include first and second nodes N1 and N2, to which first and second voltages are respectively applied. The first voltage may be a power voltage VDD and the second voltage may be a ground voltage VSS, but the first and second voltages may not be limited thereto. The decoupling circuit may include first and second capacitors C1 and C2, which are connected in series between the first and second nodes N1 and N2. For example, the first capacitor C1 may connect the first node N1 to the common electrode 140 in series, and the second capacitor C2 may connect the common electrode 140 to the second node N2 in series. Here, the common electrode 140 may be used as a capacitor electrode for both of the first and second capacitors C1 and C2 and may be electrically separated from other elements other than the first and second capacitors C1 and C2.

The decoupling circuit of FIG. 12 may have the decoupling structure shown in FIG. 13. Referring to FIG. 13, the decoupling structure may include a pair of interconnection lines 150, a pair of conductive plates 107, the common electrode 140 provided on the conductive plates 107, and the conductive patterns CP provided on each of the conductive plates 107. Each of the pair of conductive plates 107 may be connected to one of the pair of the interconnection lines 150. The conductive patterns CP may be in contact with a top surface of each of the conductive plates 107 and may be disposed in the common electrode 140. Some of the conductive patterns CP contacting one of the pair of the conductive plates 107 may constitute an electrode of the first capacitor C1, and some of the conductive patterns CP contacting the other of the pair of the conductive plates 107 may constitute an electrode of the second capacitor C2. The pair of interconnection lines 150 may serve as the first and second nodes N1 and N2 of FIG. 12. In other words, the pair of interconnection lines 150 may be applied with the power and ground voltages VDD and VSS.

The decoupling structure may further include a supporting structure, which is disposed in the common electrode 140 and is in contact with sidewalls of the conductive patterns CP. In some embodiments, the supporting structure may include an upper supporting layer 120 in that is contact with upper sidewalls of the conductive patterns CP. The supporting structure may further include an intermediate supporting layer 110 that is in contact with intermediate sidewalls of the conductive patterns CP.

The decoupling structure may further include a capacitor dielectric layer electrically isolating the common electrode 140 from the conductive patterns CP. The capacitor dielectric layer may be interposed between the common electrode 140 and the conductive patterns CP and between the common electrode 140 and the intermediate and upper supporting layers 110 and 120. Accordingly, the common electrode 140 and the conductive patterns CP may be capacitively coupled to each other, thereby serving as a capacitor.

Each of the conductive plates 107 may be electrically connected to the conductive patterns CP provided thereon. The conductive plates 107 may be formed of or include at least one conductive material. For example, the conductive plates 107 may be formed of or include at least one of metal, metal nitride, metal silicide, or doped semiconductor material. Furthermore, the conductive plates 107 may be spaced apart from each other by a separation region CNR interposed therebetween. Accordingly, the conductive plates 107 may be electrically isolated from each other. In some embodiments, a horizontal distance between the conductive plates 107 (i.e., a width of the separation region CNR in the X direction) may be greater than a minimum length of a space between the conductive patterns CP in the X direction or the Y direction and may be less than a vertical height of each of the conductive patterns CP in the Z direction. For example, the horizontal distance between the conductive plates 107 may be larger than the minimum length of the space between the conductive patterns CP and may be less than three times a distance between top surfaces of the conductive pattern CP and a top surface of the common electrode 140.

Each of the intermediate and upper supporting layers 110 and 120 may have a unitary structure. For example, each of the intermediate and upper supporting layers 110 and 120 may extend across the separation region CNR and support all of the conductive patterns CP provided on both of the pair of conductive plates 107.

Figure 14:
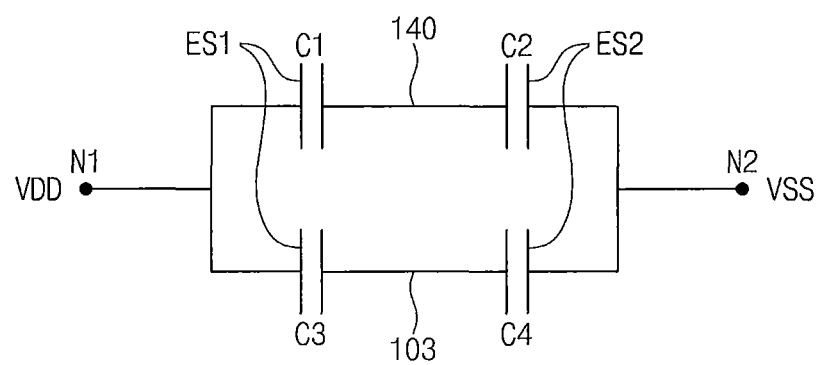
FIG. 14 is a circuit diagram illustrating a decoupling circuit according to example embodiments of the inventive concepts.
Figure 15:
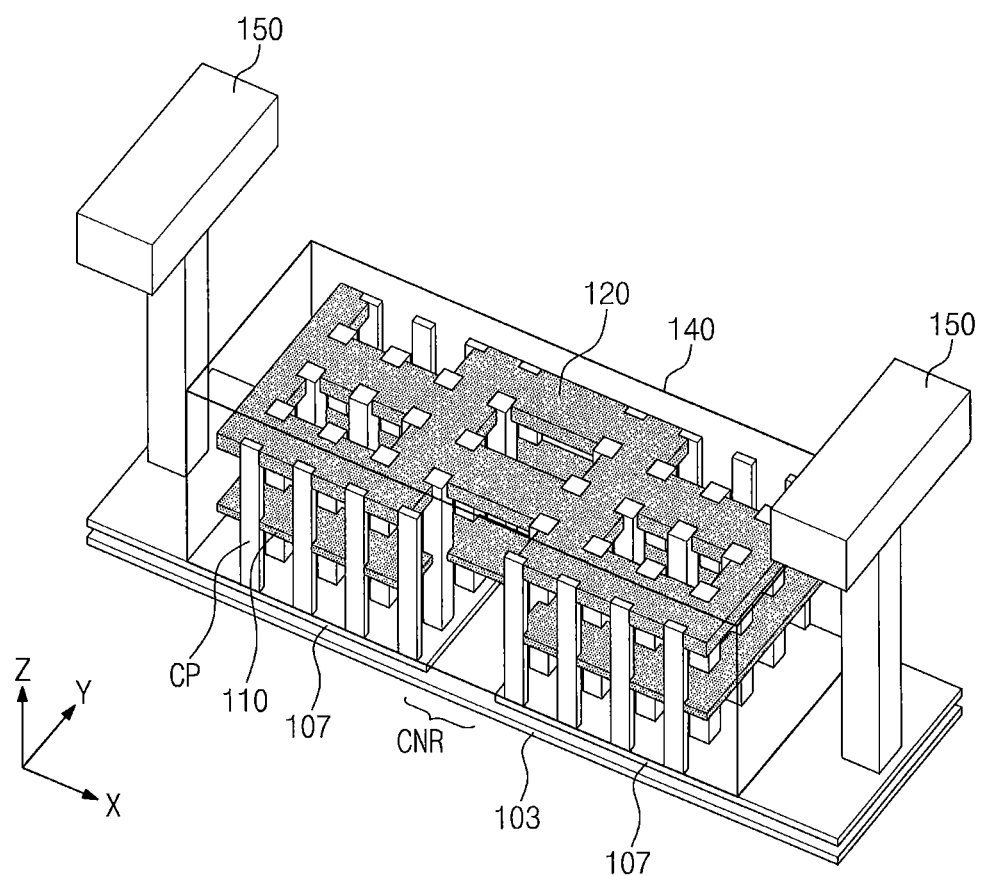
FIG. 15 is a perspective view illustrating a decoupling structure according to example embodiments of the inventive concepts.
Figure 16:
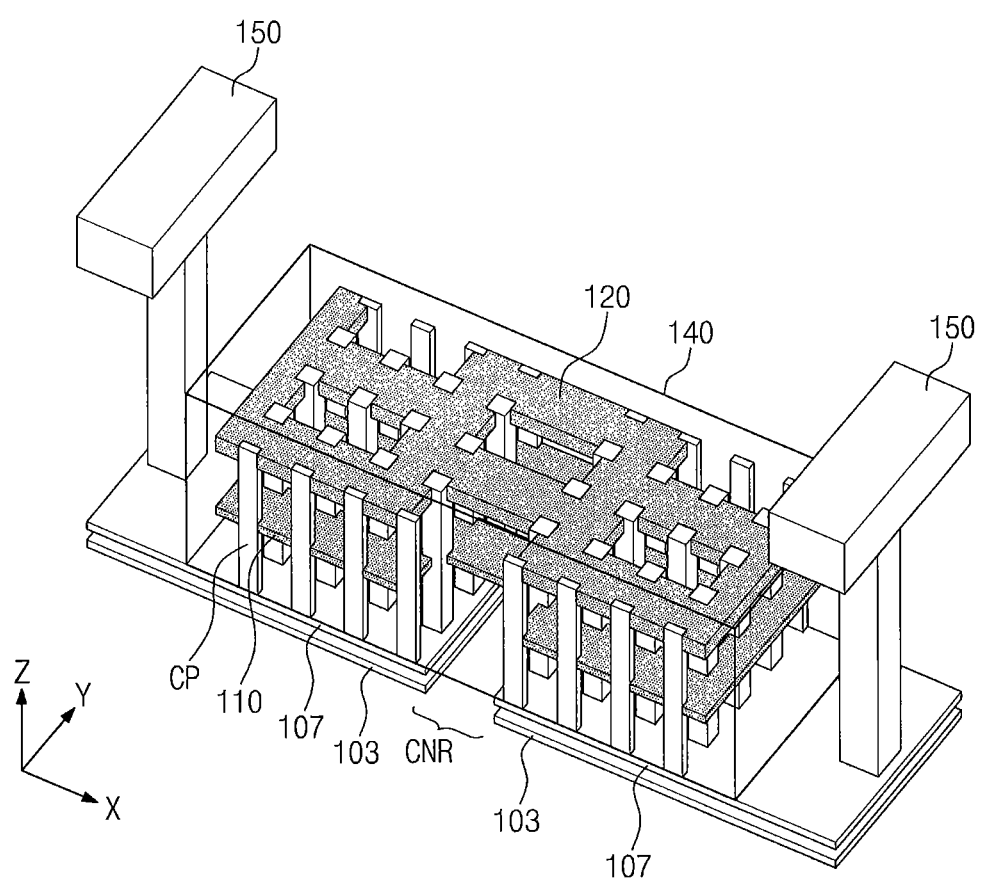
FIG. 16 is a perspective view illustrating a decoupling structure according to example embodiments of the inventive concepts.

FIG. 14 is a circuit diagram illustrating a decoupling circuit according to example embodiments of the inventive concepts. FIG. 15 is a perspective view illustrating a decoupling structure according to other example embodiments of the inventive concepts, and FIG. 16 is a perspective view illustrating a decoupling structure according to further example embodiments of the inventive concepts.

Referring to FIGS. 12 and 14, the decoupling circuit of FIG. 14 may further include third and fourth capacitors C3 and C4 that are connected in parallel to the first and second capacitors C1 and C2. The third and fourth capacitors C3 and C4 may be configured to share at least one lower conductive plate 103. For example, as shown in FIGS. 15 and 16, the at least one lower conductive plate 103 may be provided below the conductive plates 107 and may be capacitively coupled to the conductive plates 107. The at least one lower conductive plate 103 may be electrically separated from other elements other than the third and fourth capacitors C3 and C4. Further, in the case where a semiconductor device is a memory chip including a memory cell array, the lower conductive plate 103 may be a conductive layer serving as bit lines or gate electrodes. In some embodiments, the lower conductive plate 103 may be a single plate, as shown in FIG. 15, and the lower conductive plate 103 may face the pair of conductive plates 107. In some embodiments, as shown in FIG. 16, the lower conductive plate 103 may be a pair of plates, and each of the pair of plates of the lower conductive plate 103 may face one of the pair of conductive plates 107.

Figure 17:
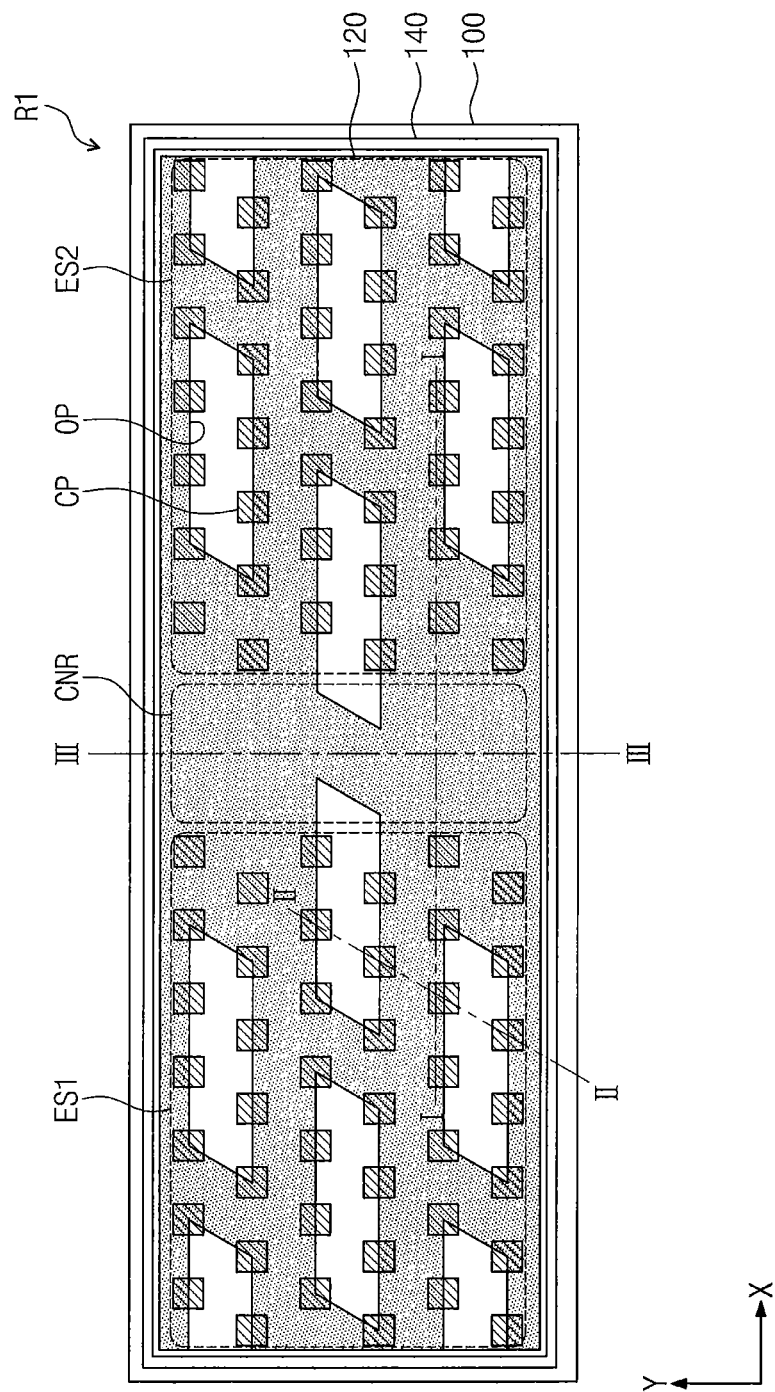
FIGS. 17 and 17A are enlarged plan views of the region R1 of FIG. 1 illustrating a capacitor structure according to example embodiments of the inventive concepts.
Figure 17A:
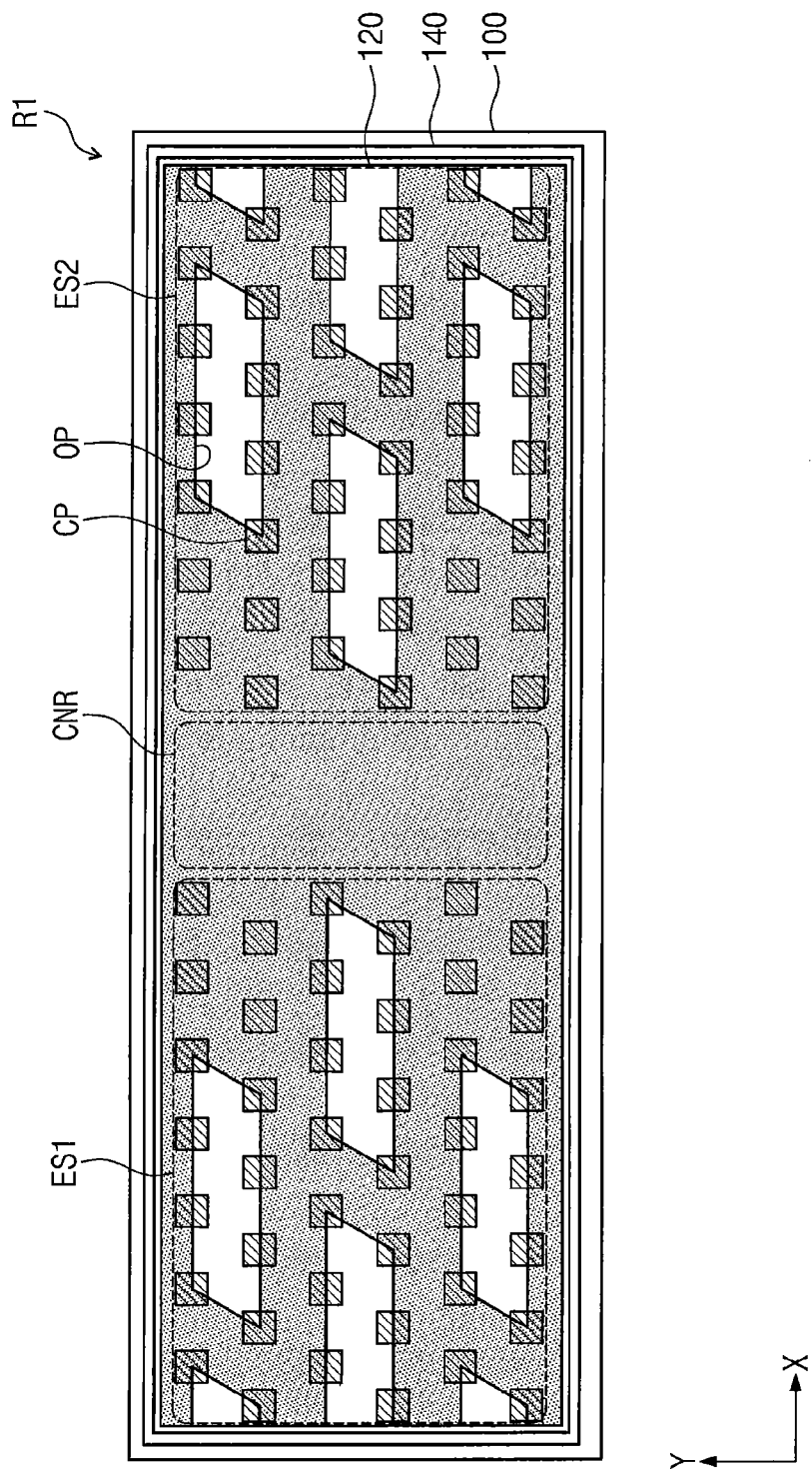
Figure 18:
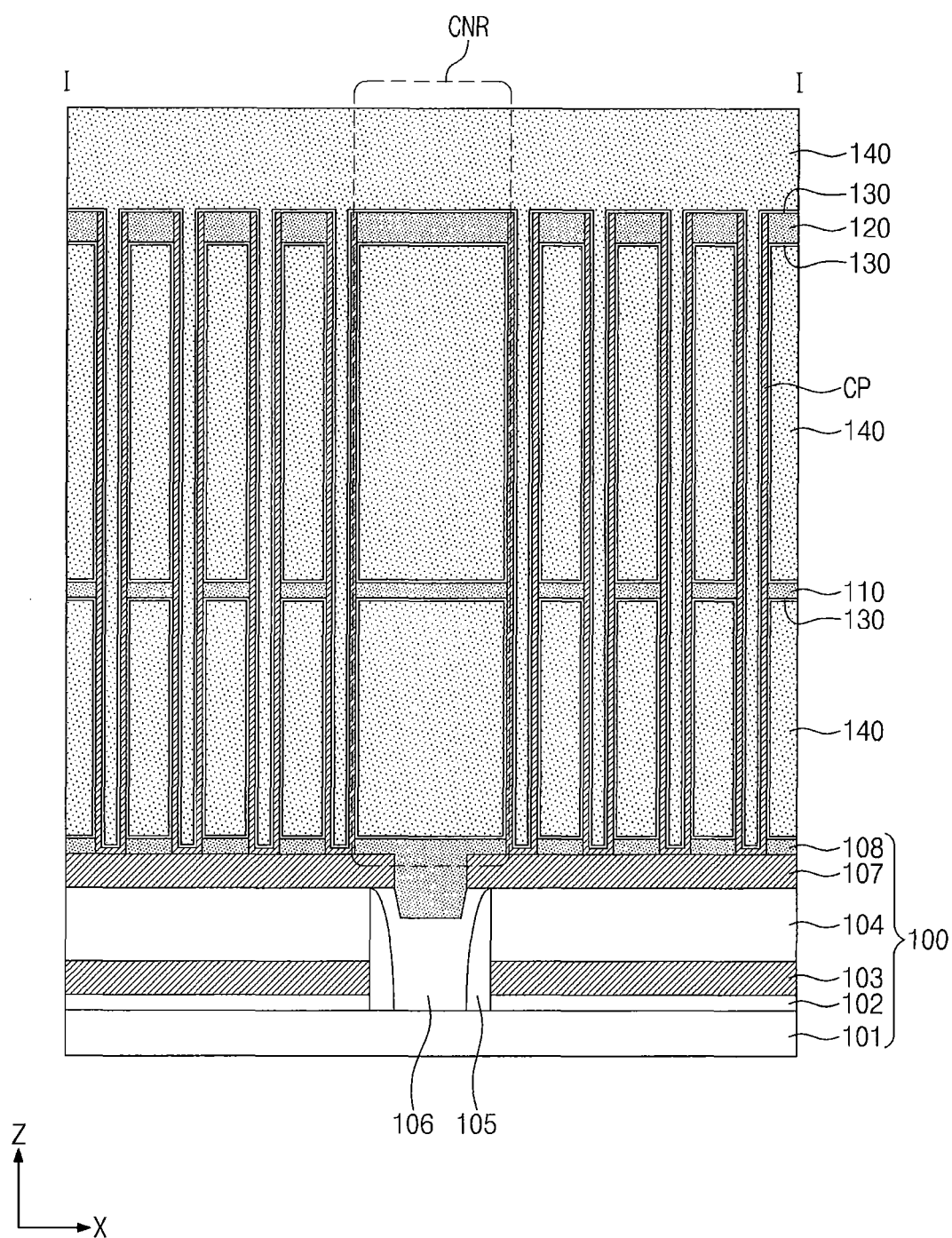
FIGS. 18, 19 and 20 are sectional views taken along the dotted lines I-I, II-II and III-III of FIG. 17, respectively.
Figure 19:
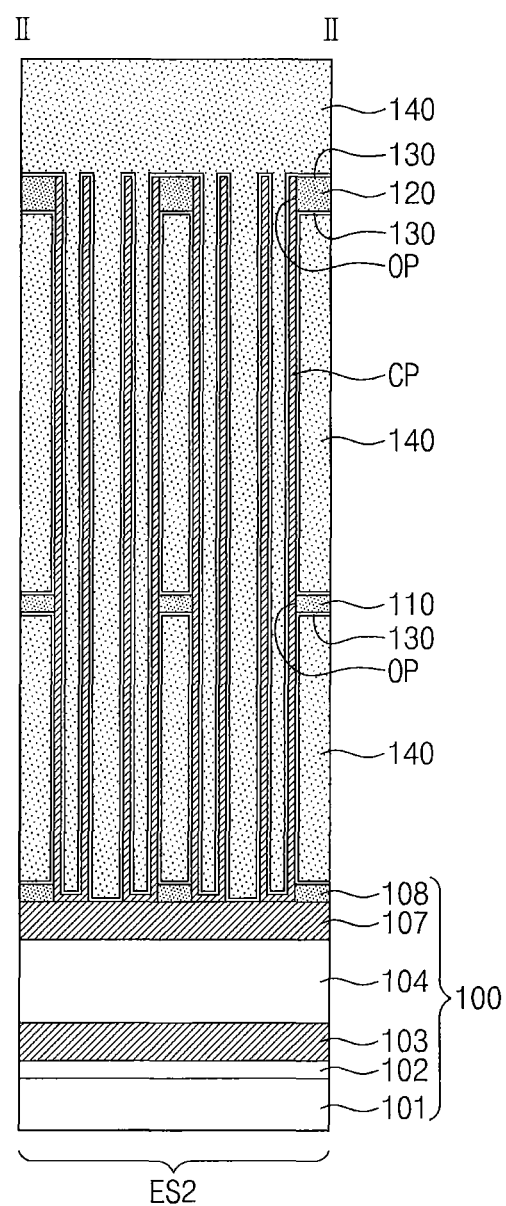
Figure 20:
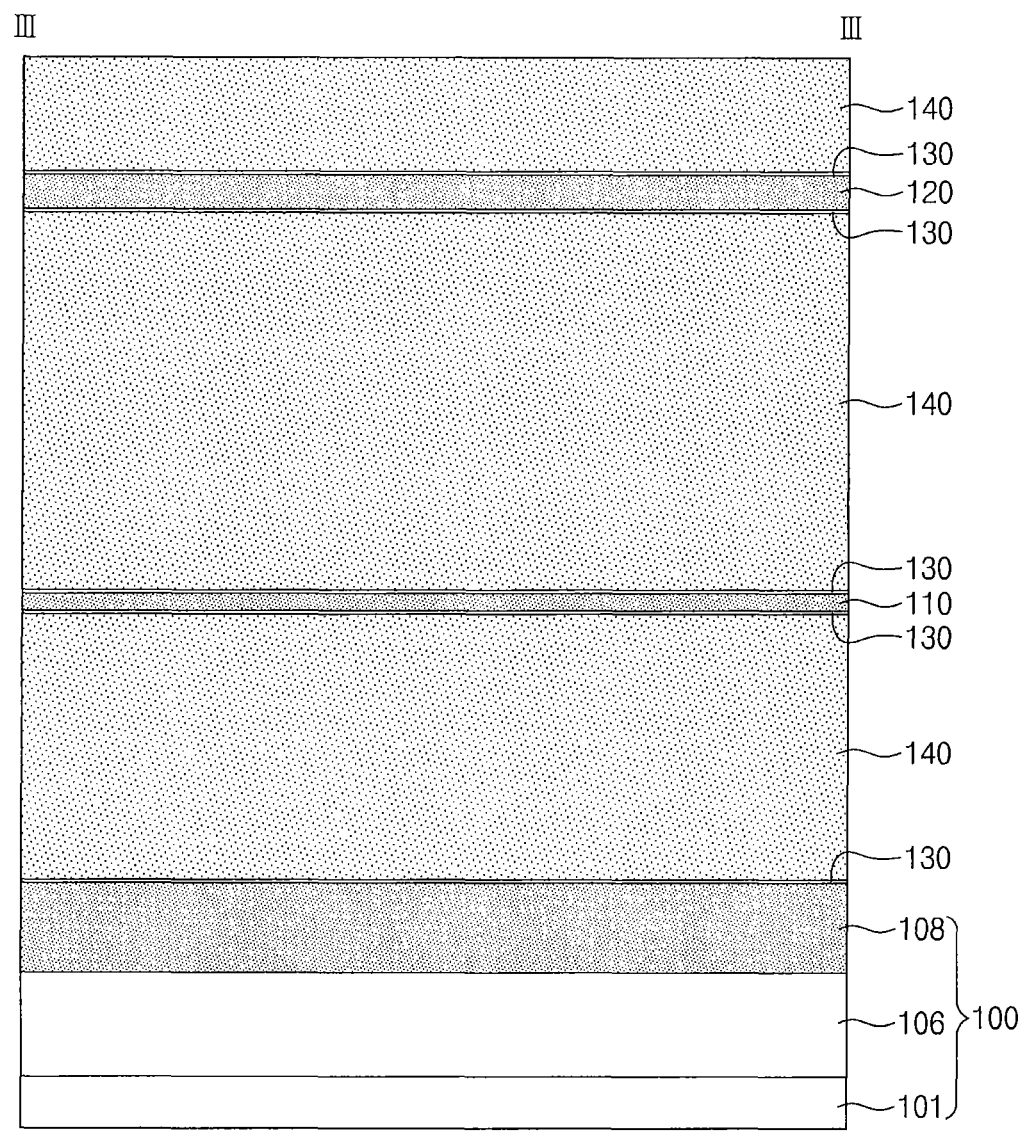
Figure 21:
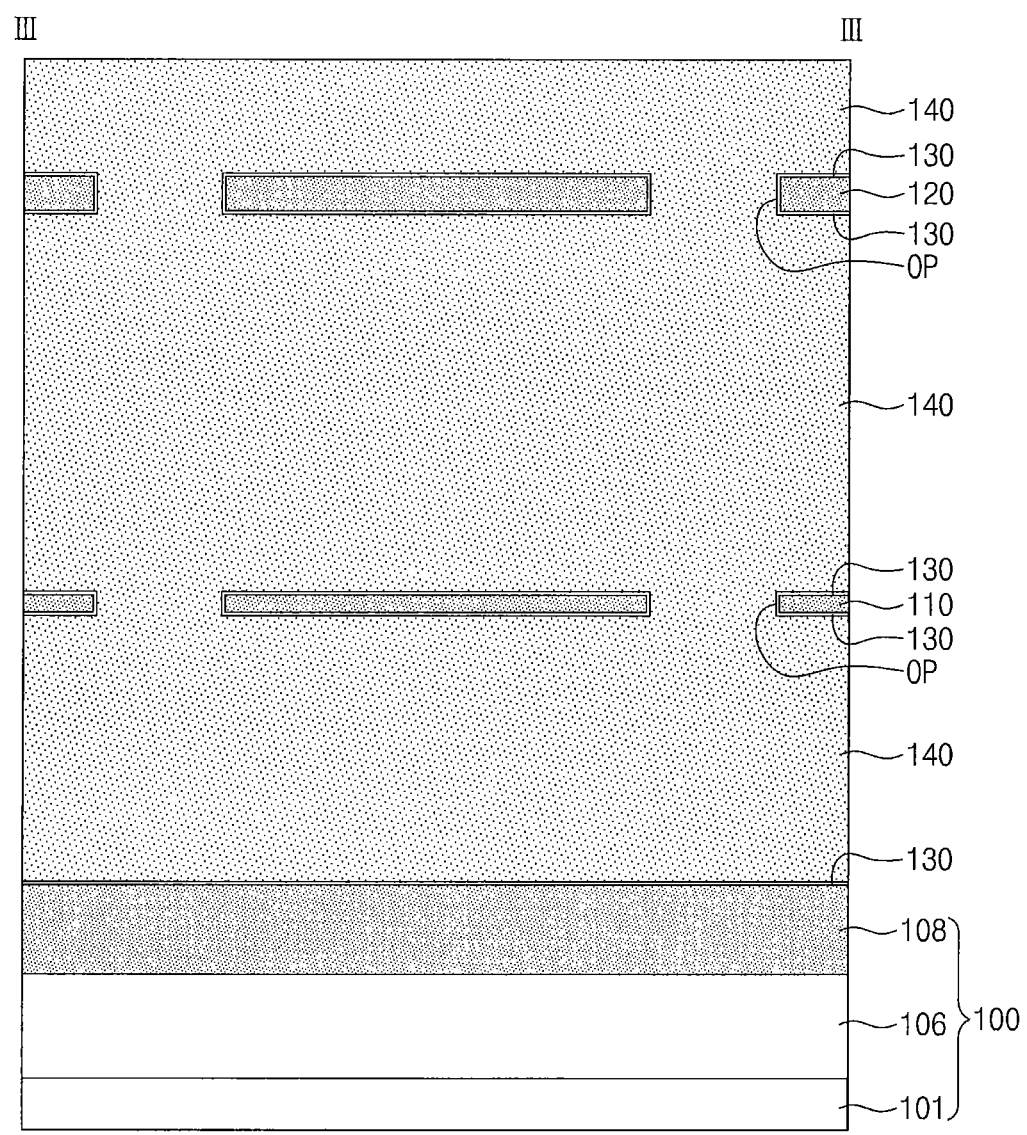
FIG. 21 is a sectional view taken along the dotted line III-III of FIG. 3.

FIGS. 17 and 17A are enlarged plan views of the region R1 of FIG. 1 illustrating a capacitor structure according to example embodiments of the inventive concepts. FIGS. 18, 19 and 20 are sectional views taken along the dotted lines I-I, and of FIG. 17, respectively. FIG. 21 is a sectional view taken along the dotted line of FIG. 3.

Referring to FIGS. 17 and 17A, each of the intermediate and upper supporting layers 110 and 120 may have a unitary structure and may support all of the conductive patterns CP in the first and second electrode structures ES1 and ES2. Each of the intermediate and upper supporting layers 110 and 120 may extend across the separation region CNR disposed between the first and second electrode structures ES1 and ES2. Each of the intermediate and upper supporting layers 110 and 120 may be formed to substantially cover a separation region CNR. Each of the intermediate and upper supporting layers 110 and 120 may include openings OP. Only portions of the openings OP are disposed in the separation region CNR. None of the openings OP extend all the way across the separation region CNR. In some embodiments, none of the openings OP may extend into the separation region CNR such that the separation region CNR is free of the openings OP as illustrated in FIG. 17A. A top surface of the common electrode 140 may be planar on the separation region CNR. The top surface of the common electrode 140 may be positioned at a level higher than top surfaces of the conductive patterns CP in the separation region CNR.

Referring to FIGS. 18 through 20, a capacitor structure may include the conductive plates 107 and the lower conductive plates 103 provided below the conductive plates 107. The lower conductive plates 103 may be vertically separated from a substrate 101 by a first lower insulating layer 102, and the conductive plates 107 may be vertically separated from the lower conductive plates 103 by a second lower insulating layer 104.

Insulating spacers 105 may be provided in or near the separation region CNR to cover sidewalls of the lower conductive plates 103. An insulating gap-fill layer 106 may be provided between the insulating spacers 105, and a lower supporting layer 108 may be provided between the conductive plates 107. The lower supporting layer 108 may extend horizontally in the first and second electrode structures ES1 and ES2 to cover lower sidewalls of the conductive patterns CP. The lower supporting layer 108 may be formed of or include a nitride layer (e.g., a silicon nitride layer or a silicon oxynitride layer) and may be used as a part of the supporting structure. In some embodiments, during a process for fabricating the capacitor structure, the lower supporting layer 108 may be used as an etch stop layer. The substrate 101, the first lower insulating layer 102, the lower conductive plate 103, the second lower insulating layer 104, the conductive plates 107 and the lower supporting layer 108 may constitute the lower structure 100.

The lower supporting layer 108 may be formed to fill a space between the conductive plates 107. In other words, a portion of the lower supporting layer 108 may protrude toward the substrate 101 in the space between the conductive plates 107. The lower supporting layer 108 may have a bottom surface that is lower than bottom surfaces of the conductive plates 107. The lower supporting layer 108 may include a T-shaped portion provided in the separation region CNR.

As shown in FIGS. 20 and 21, the separation region CNR between the first and second electrode structures ES1 and ES2 may include only the common electrode 140, the supporting structure (e.g., the intermediate and upper supporting layers 110 and 120) and the capacitor dielectric layer 130. Accordingly, the only conductive material provided in the separation region CNR may be the common electrode 140. Insulating structures provided in the separation region CNR may be the supporting structure and the capacitor dielectric layer 130.

In some embodiments, a seam or a void may be formed in a portion of the common electrode 140 provided in the separation region CNR (e.g., voids 141 of FIGS. 7 and 8), and the insulating structure in the separation region CNR may include the supporting structure, the capacitor dielectric layer 130 and the seam or void. It can be understood that the seam or void in the common electrode 140 may not cause an electrical failure.

In some embodiments, as shown in FIG. 18, each of the intermediate and upper supporting layers 110 and 120 may be formed in such a way that top and bottom surfaces thereof have a planarized or flat profile in the separation region CNR. Accordingly, a portion of the upper supporting layer 120 disposed in the separation region CNR may have an upper surface higher than a lower surface of a portion of the upper supporting layer 120 disposed outside of the separation region CNR. A portion of the intermediate supporting layer 110 disposed in the separation region CNR may have an upper surface higher than a lower surface of a portion of the intermediate supporting layer 110 disposed outside of the separation region CNR.

Figure 22:
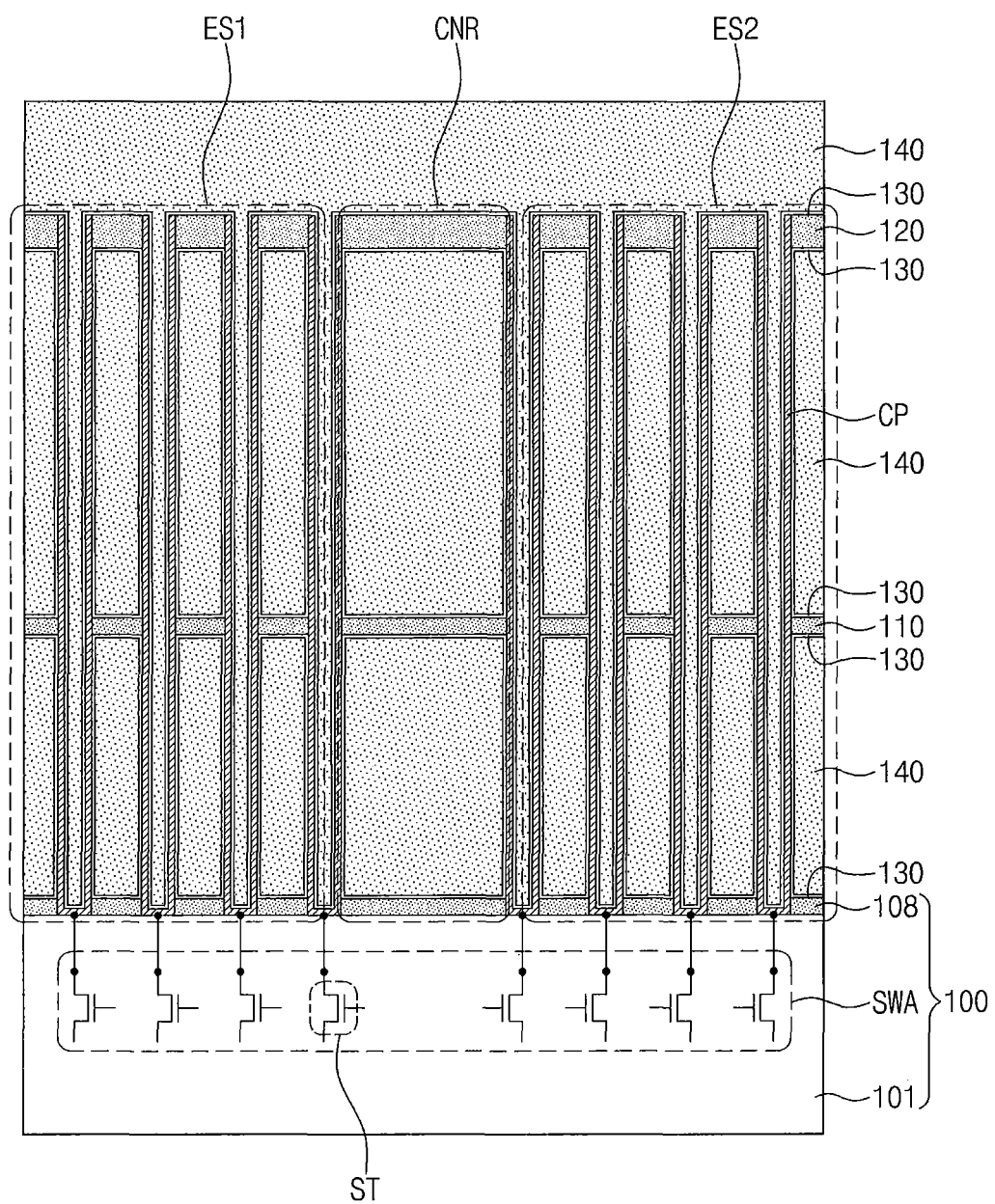
FIG. 22 is a sectional view illustrating a semiconductor memory device including a capacitor structure according to example embodiments of the inventive concepts.

FIG. 22 is a sectional view illustrating a semiconductor memory device including a capacitor structure according to example embodiments of the inventive concepts. The semiconductor memory device may include a capacitor structure according to some embodiments of the inventive concepts. The capacitor structure may be included in a memory cell array of the semiconductor memory device (e.g., DRAM). For example, the semiconductor memory device may further include a switching array SWA provided below the capacitor structure, and the switching array SWA may include a plurality of switching transistors ST, which are coupled to the conductive patterns CP, respectively. The conductive patterns CP in each of the first and second electrode structures ES1 and ES2 may serve as a unit block of the semiconductor memory device.

Figure 23:
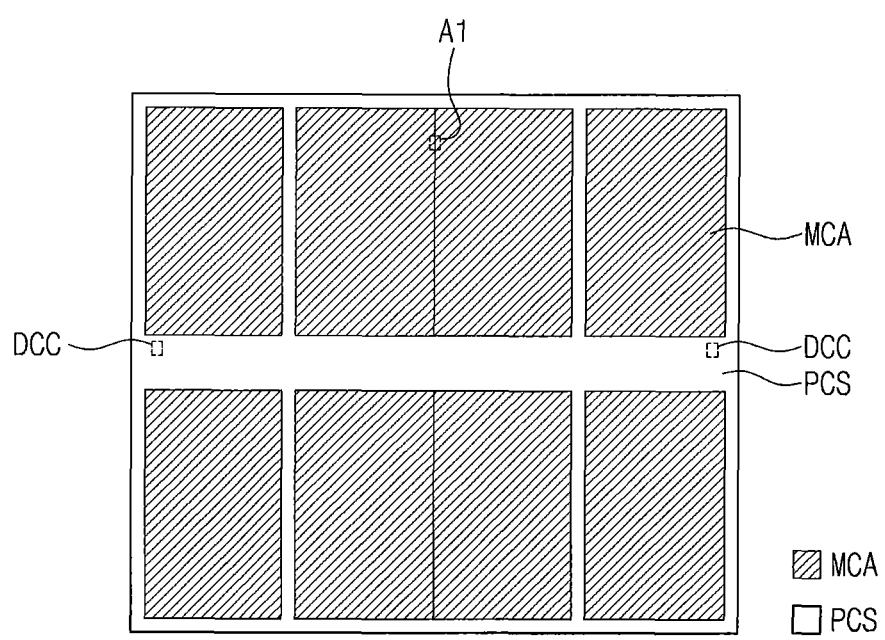
FIG. 23 is a plan view illustrating a semiconductor memory device according to example embodiments of the inventive concepts.

FIG. 23 is a plan view illustrating a semiconductor memory device according to example embodiments of the inventive concepts. Referring to FIG. 23, a semiconductor memory device may include a memory cell array MCA and a peripheral circuit structure PCS. A plurality of memory cells may be provided in the memory cell array MCA, and peripheral circuits that are configured to drive the memory cells may be provided in the peripheral circuit structure PCS.

In example embodiments, the semiconductor memory device may be a DRAM chip using a capacitor as a memory element in each memory cell. For example, the memory cell array MCA may have the structures described with reference to FIG. 22. For example, a portion A1 of the memory cell array MCA may include the conductive patterns CP, which are used as lower electrodes of electrically-separated capacitors, and the switching transistors ST, which are configured to control inputs to the conductive patterns CP.

In some embodiments, the peripheral circuit structure PCS may include at least one portion that includes a capacitor structure or a decoupling structure according to some embodiments of the inventive concepts. For example, the peripheral circuit structure PCS may include a plurality of decoupling circuits DCC, each of which may be, for example, one of the decoupling structures described with reference to FIGS. 12 through 21.

Figure 24:
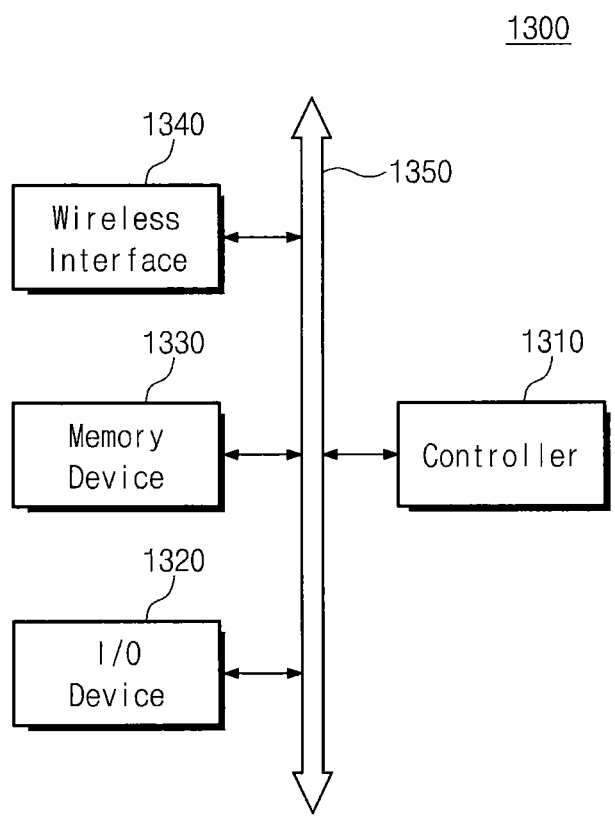
FIGS. 24 and 25 are schematic block diagrams illustrating electronic devices including a semiconductor device according to example embodiments of the inventive concepts.
Figure 25:
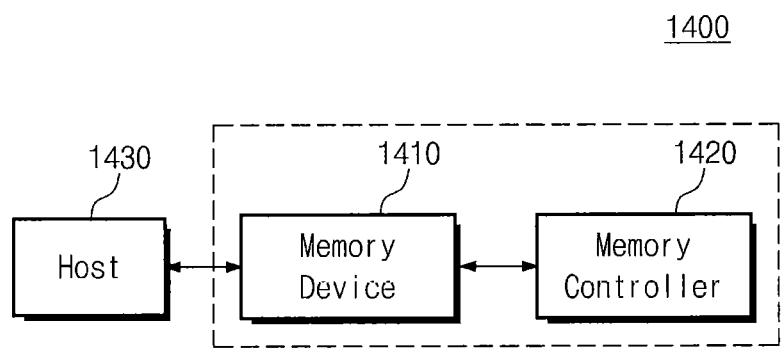

FIGS. 24 and 25 are schematic block diagrams illustrating electronic devices including a semiconductor device according to example embodiments of the inventive concepts.

Referring to FIG. 24, an electronic device 1300 including a semiconductor device according to example embodiments of the inventive concepts may be one of a personal digital assistant (PDA), a laptop computer, a mobile computer, a web tablet, a wireless phone, a cell phone, a digital music player, a wire or wireless electronic device, or a complex electronic device including at least two thereof. The electronic device 1300 may include a controller 1310, an input/output device 1320 such as a keypad, a keyboard, a display, a memory device 1330, and a wireless interface 1340 that are in communication with each other through a bus 1350. The controller 1310 may include, for example, at least one microprocessor, a digital signal process, a microcontroller or the like. The memory device 1330 may be configured to store a command code to be used by the controller 1310 or a user data. The memory device 1330 may include a semiconductor device according to example embodiments of the inventive concepts. The electronic device 1300 may use a wireless interface 1340 that is configured to transmit data to or receive data from a wireless communication network using a RF signal. The wireless interface 1340 may include, for example, an antenna, a wireless transceiver and so on. The electronic system 1300 may be used in a communication interface protocol of a communication system such as, for example, CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced and MMDS.

Referring to FIG. 25, a memory system including a semiconductor device according to example embodiments of the inventive concepts will be described. The memory system 1400 may include a memory device 1410 for storing data and a memory controller 1420. The memory controller 1420 may control the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of the inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which a semiconductor memory device according to example embodiments may be mounted may further include at least one semiconductor device (e.g., a controller and/or a logic device) that is configured to control the semiconductor memory device.

According to example embodiments of the inventive concepts, a decoupling structure may include at least one supporter and a pair of electrode structures. The supporter may have a unitary structure supporting the pair of electrode structures. The use of the decoupling structure may reduce a size of a semiconductor device and increase a portion of an area of a main functional circuit in a chip of the semiconductor device.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device, comprising:
a decoupling structure having a first capacitor and a second capacitor that is different from the first capacitor, the decoupling structure comprising:
a first plurality of conductive patterns that each extend in a vertical direction;
a second plurality of conductive patterns that each extend in the vertical direction;
a horizontally disposed unitary supporting structure that structurally supports the first plurality of conductive patterns and the second plurality of conductive patterns; and
a common electrode disposed between ones of the first plurality of conductive patterns and between ones of the second plurality of conductive patterns,
wherein the first plurality of conductive patterns and the common electrode comprise electrodes of the first capacitor, and the second plurality of conductive patterns and the common electrode comprise electrodes of the second capacitor,
wherein the first plurality of conductive patterns and the second plurality of conductive patterns are horizontally spaced apart from each other in a first direction with a separation region therebetween,
wherein the decoupling structure is mounted on an underlying lower structure so that the lower structure and the decoupling structure are stacked in the vertical direction, and the unitary supporting structure comprises a plurality of openings when viewed from above, and
wherein none of the plurality of openings extend into the separation region.

2. The integrated circuit device of claim 1, wherein a minimum width of each of the plurality of openings is less than two times a thickness in the vertical direction of a portion of the common electrode that is disposed on an upper surface of the unitary supporting structure.

3. The integrated circuit device of claim 1, wherein a width of the separation region in the first direction is less than two times a thickness in the vertical direction of a portion of the common electrode that is disposed on an upper surface of the unitary supporting structure.

4. The integrated circuit device of claim 1, wherein:
a first portion of the common electrode overlies an upper surface of the unitary supporting structure; and
an upper surface of the first portion of the common electrode is disposed at a level higher than an upper surface of each of the first plurality of conductive patterns.

5. The integrated circuit device of claim 4, wherein the upper surface of the unitary supporting structure is disposed at a level higher than the upper surface of the each of the first plurality of conductive patterns.

6. The integrated circuit device of claim 1, further comprising:
a substrate underneath the decoupling structure; and
a pair of conductive plates disposed between the substrate and the common electrode, wherein:
the pair of conductive plates comprises a first conductive plate that is electrically connected to the first plurality of conductive patterns and a second conductive plate that is electrically connected to the second plurality of conductive patterns; and
the first conductive plate and the second conductive plate are horizontally spaced apart from each other with a gap therebetween, the gap being disposed between the first plurality of conductive patterns and the second plurality of conductive patterns.

7. The integrated circuit device of claim 6, further comprising an insulating pattern between the pair of conductive plates and the common electrode, wherein the insulating pattern comprises an upper portion and a lower portion that protrudes toward the substrate in the gap between the first conductive plate and the second conductive plate.

8. The integrated circuit device of claim 6, further comprising a third conductive plate between the pair of conductive plates and the substrate.

9. The integrated circuit device of claim 8, wherein the first conductive plate and the third conductive plate comprise electrodes of a third capacitor, and the second conductive plate and the third conductive plate comprise electrodes of a fourth capacitor that is different from the third capacitor.

10. The integrated circuit device of claim 9, wherein:
the first capacitor and the second capacitor are connected in series, and the third capacitor and the fourth capacitor are connected in series; and
the first capacitor and the second capacitor are connected in parallel to the third capacitor and the fourth capacitor.

11. The integrated circuit device of claim 6, wherein:
the gap between the first conductive plate and the second conductive plate comprises a first gap; and
the integrated circuit device further comprises a third conductive plate and a fourth conductive plate between the pair of conductive plates and the substrate, wherein:
the third conductive plate and the fourth conductive plate are horizontally spaced apart from each other with a second gap therebetween;
the second gap is disposed between the first plurality of conductive patterns and the second plurality of conductive patterns; and
the first conductive plate and the third conductive plate comprise electrodes of a third capacitor, and the second conductive plate and the fourth conductive plate comprise electrodes of a fourth capacitor that is different from the third capacitor.

12. The integrated circuit device of claim 1, wherein each of the first plurality of conductive patterns has a height at least 20 times greater than a width of the each of the first plurality of conductive patterns.

13. The integrated circuit device of claim 1, wherein an unfilled void is disposed underneath the unitary supporting structure.

14. The integrated circuit device of claim 1, wherein the first plurality of conductive patterns and the second plurality of conductive patterns are spaced apart from the separation region.

15. The integrated circuit device of claim 1, wherein the first plurality of conductive patterns and the second plurality of conductive patterns are not disposed in the separation region.

16. A decoupling structure, comprising:
- a plurality of vertically disposed electrode patterns on a substrate, the plurality of electrode patterns comprising:
- first electrode patterns disposed along a first horizontal direction at a first interval; and
- second electrode patterns disposed along the first horizontal direction at a second interval, wherein the first electrode patterns and the second electrode patterns are spaced apart from each other in the first horizontal direction with a separation region therebetween, and the separation region has a width in the first horizontal direction greater than the first interval or the second interval;
- a unitary supporting structure at least partially surrounding respective sidewalls of the first electrode patterns and respective sidewalls of the second electrode patterns, wherein the unitary supporting structure comprises a plurality of openings when viewed from a plan perspective, and none of the plurality of openings extend into the separation region; and
- a common electrode disposed between ones of the first electrode patterns and between ones of the second electrode patterns.

17. The decoupling structure of claim 16, wherein the unitary supporting structure extends across the separation region.

18. The decoupling structure of claim 16, wherein the first interval and the second interval are substantially equal.

19. The decoupling structure of claim 16, wherein the decoupling structure further comprises a first capacitor and a second capacitor that is different from the first capacitor,
- wherein the first electrode patterns collectively comprise a first electrode of the first capacitor, and the common electrode comprises a second electrode of the first capacitor, and
- wherein the second electrode patterns collectively comprise a first electrode of the second capacitor, and the common electrode comprises a second electrode of the second capacitor.

20. The decoupling structure of claim 19, further comprising:
- a pair of conductive plates underneath the plurality of electrode patterns, wherein the pair of conductive plates comprises a first conductive plate that is electrically connected to the first electrode patterns and a second conductive plate that is electrically connected to the second electrode patterns.

* * * * *